United States Patent [19]
Hyatt

[11] 4,225,225
[45] Sep. 30, 1980

[54] HIGH REGISTRATION PHOTOMASK MACHINE AND COMPUTERIZED NUMERICAL CONTROL SYSTEM

[76] Inventor: Gilbert P. Hyatt, P.O. Box 4584, Anaheim, Calif. 92803

[21] Appl. No.: 950,901

[22] Filed: Oct. 12, 1978

Related U.S. Application Data

[63] Continuation-in-part of Ser. No. 879,293, Nov. 24, 1969, abandoned, and a continuation-in-part of Ser. No. 101,881, Dec. 28, 1970, and a continuation-in-part of Ser. No. 134,958, Apr. 19, 1971, and a continuation-in-part of Ser. No. 135,040, Apr. 19, 1971, and a continuation-in-part of Ser. No. 229,213, Apr. 13, 1972, Pat. No. 3,820,894, and a continuation-in-part of Ser. No. 230,872, Mar. 1, 1972, and a continuation-in-part of Ser. No. 232,459, Mar. 7, 1972, and a continuation-in-part of Ser. No. 246,867, Apr. 24, 1972, and a continuation-in-part of Ser. No. 288,247, Sep. 11, 1972, Pat. No. 4,121,284, and a continuation-in-part of Ser. No. 291,394, Sep. 22, 1972, and a continuation-in-part of Ser. No. 302,771, Nov. 1, 1972, and a continuation-in-part of Ser. No. 325,933, Jan. 22, 1973, Pat. No. 4,016,540, and a continuation-in-part of Ser. No. 325,941, Jan. 22, 1973, Pat. No. 4,060,848, and a continuation-in-part of Ser. No. 366,714, Jun. 4, 1973, Pat. No. 3,986,022, and a continuation-in-part of Ser. No. 727,330, Sep. 27, 1976, abandoned, and a continuation-in-part of Ser. No. 339,688, Mar. 9, 1973, and a continuation-in-part of Ser. No. 402,520, Oct. 1, 1973, and a continuation-in-part of Ser. No. 476,743, Jun. 5, 1974, and a continuation-in-part of Ser. No. 752,751, Dec. 20, 1976, Pat. No. 4,120,583, and a continuation-in-part of Ser. No. 752,240, Dec. 20, 1976, abandoned.

[51] Int. Cl.² ........................................... G03B 27/02
[52] U.S. Cl. .................................... 355/78; 354/4; 355/53; 355/95; 358/302
[58] Field of Search ............... 354/4; 355/67, 69, 78, 355/53, 95, 14, 6; 340/147 R, 723, 724, 799; 364/515, 519, 523, 525; 178/15; 358/302

[56] References Cited
U.S. PATENT DOCUMENTS
3,738,242 6/1973 Lee et al. ............................... 354/4

Primary Examiner—Richard A. Wintercorn
Attorney, Agent, or Firm—Gilbert P. Hyatt

[57] ABSTRACT

A photographic system and a microcomputer based control system are provided for providing photographic exposures. An illumination control system for generating high registration photomasks is provided. A control system implemented with a monolithic microcomputer controls a photographic device through a minimal interface for high capability and economy.

10 Claims, 30 Drawing Figures

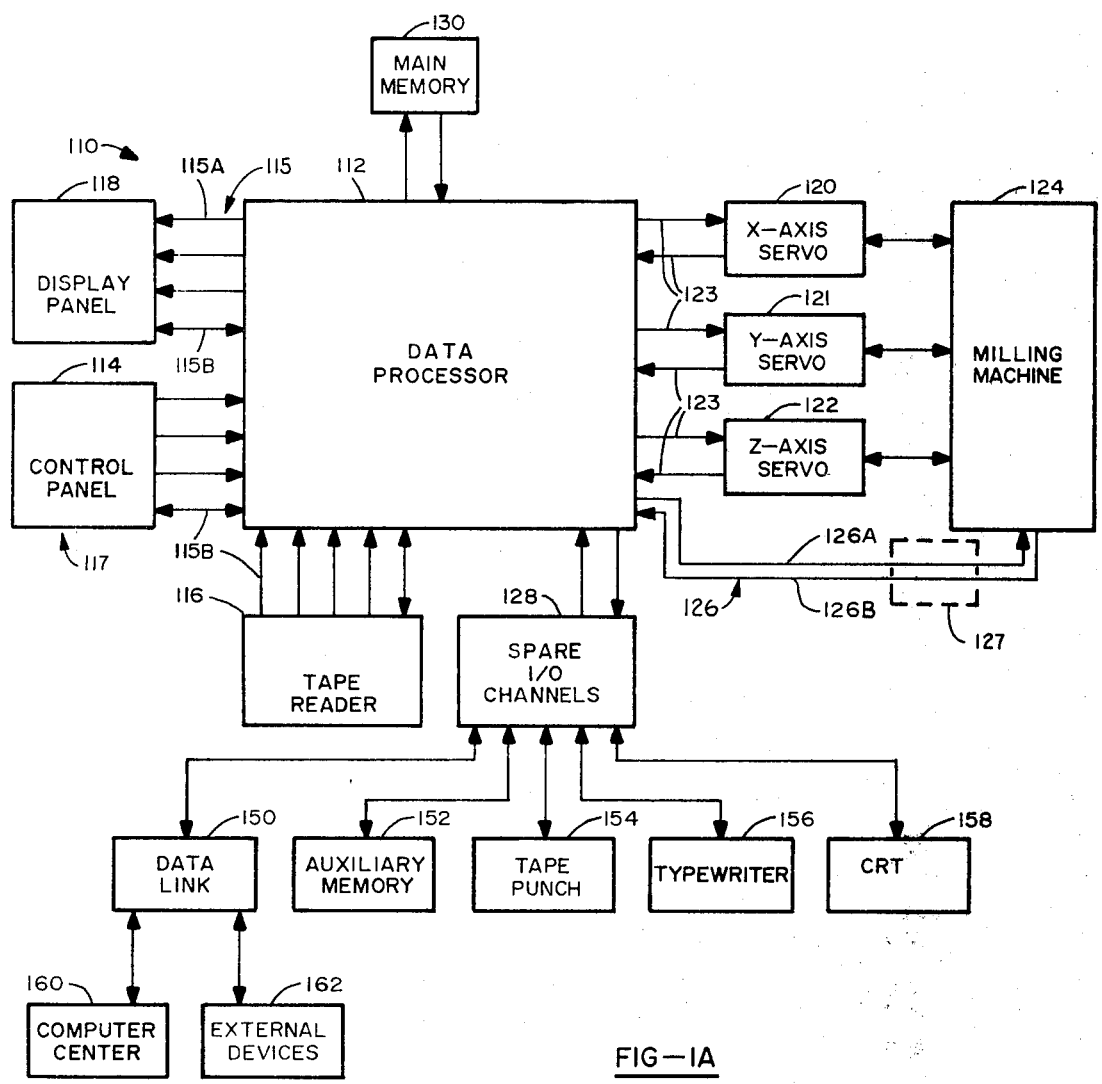
FIG—1A
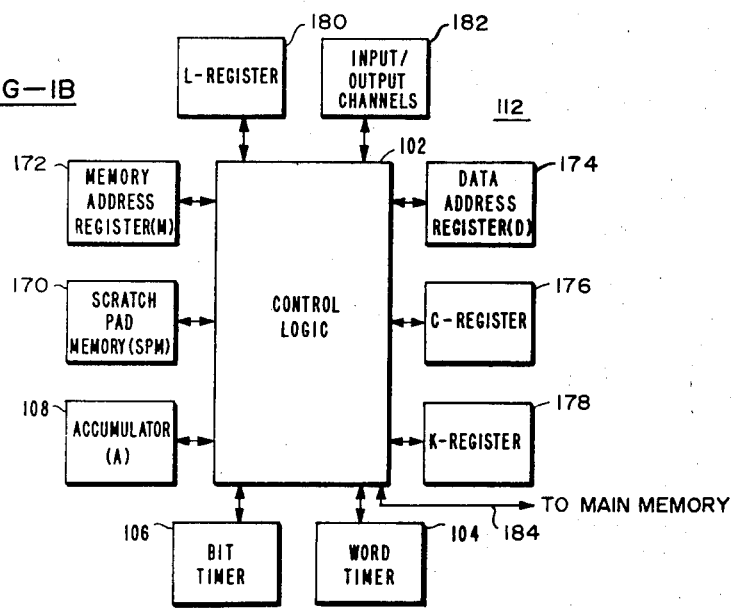
FIG—1B

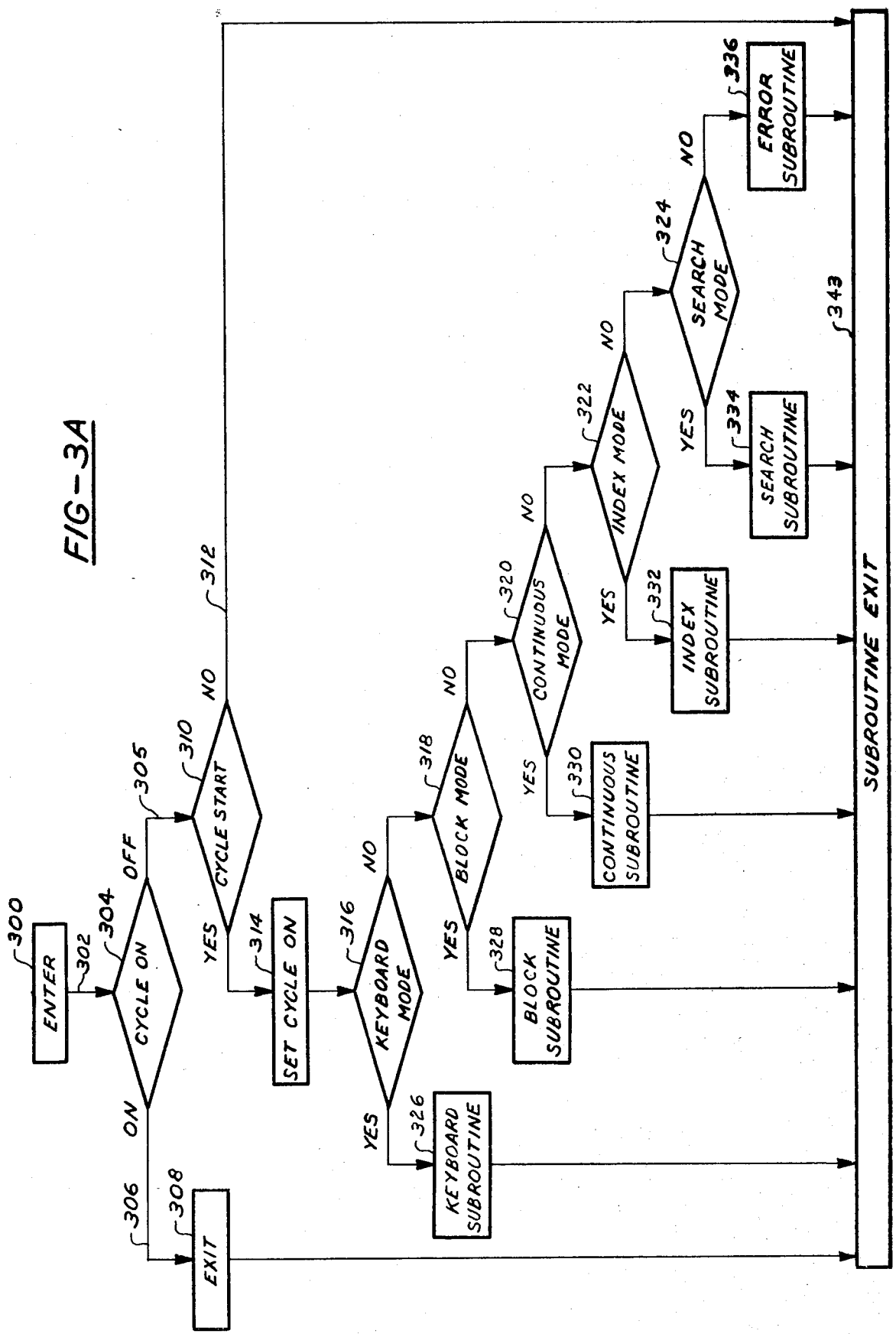

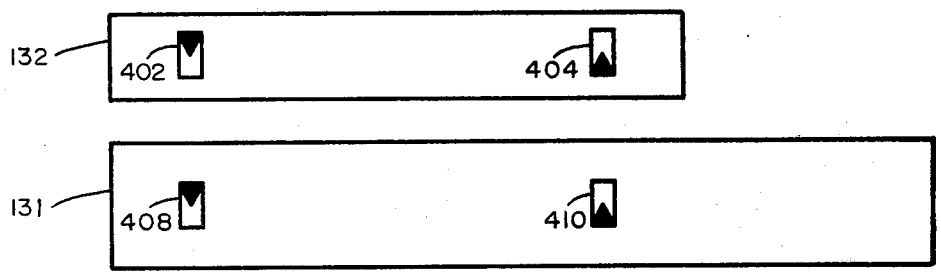
FIG-4A
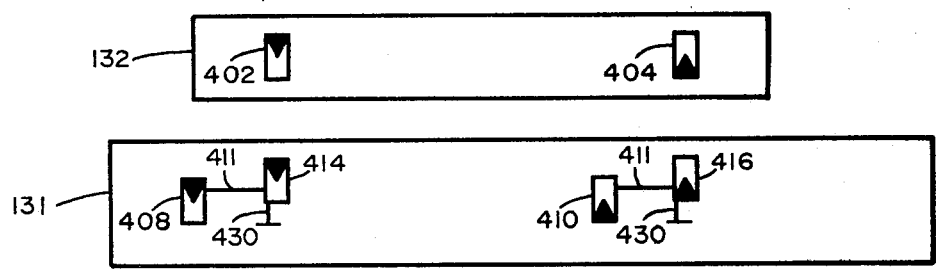
FIG-4B
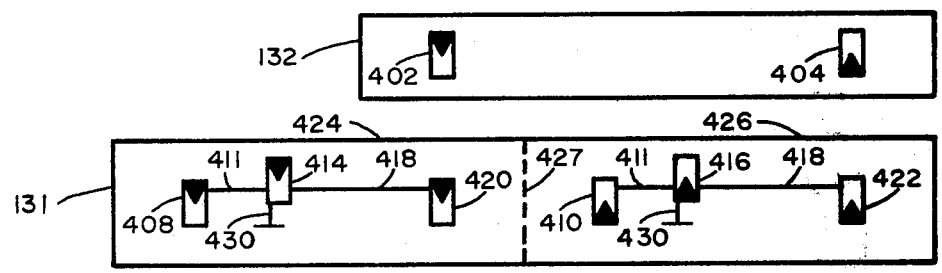
FIG-4C
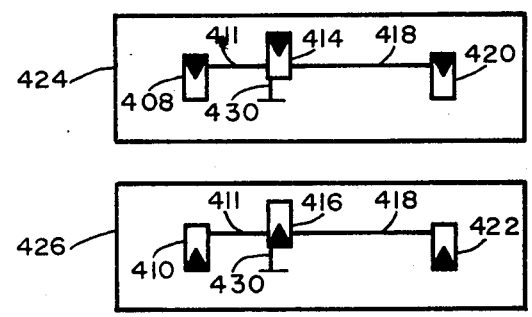
FIG-4D
FIG-4E
FIG-4

HIGH REGISTRATION PHOTOMASK MACHINE AND COMPUTERIZED NUMERICAL CONTROL SYSTEM

CROSS-REFERENCE TO RELATED APPLICATIONS

This application is a continuation-in-part of the chain of copending applications:

1. METHOD AND APPARATUS FOR PROCESSING THE DIGITAL OUTPUT OF AN INPUT MEANS Ser. No. 879,293 filed on Nov. 24, 1969 now abandoned in favor of a continuing application;

2. FACTORED DATA PROCESSING SYSTEM FOR DEDICATED APPLICATIONS Ser. No. 101,881 filed on Dec. 28, 1970;

3. CONTROL SYSTEM AND METHOD Ser. No. 134,958 filed on Apr. 19, 1971;

4. CONTROL APPARATUS Ser. No. 135,040 filed on Apr. 19, 1971;

5. APPARATUS AND METHOD FOR PRODUCING HIGH REGISTRATION PHOTO-MASKS Ser. No. 229,213 filed Apr. 13, 1972 now U.S. Pat. No. 3,820,894 issued on June 28, 1974;

6. MACHINE CONTROL SYSTEM OPERATING FROM REMOTE COMMANDS Ser. No. 230,872 filed on Mar. 1, 1972;

7. COORDINATE RESOLUTION FOR NUMERICAL CONTROL SYSTEMS Ser. No. 232,459 filed on Mar. 7, 1972 and issuing substantially cotemporaneously herewith;

8. DIGITAL FEEDBACK CONTROL SYSTEM Ser. No. 246,867 filed on Apr. 24, 1972 and issuing substantially cotemporaneously herewith;

9. COMPUTERIZED SYSTEM FOR OPERATOR INTERACTION Ser. No. 288,247 filed on Sept. 11, 1972 now U.S. Pat. No. 4,121,284 issued on Oct. 17, 1978;

10. STORED PROGRAM DATA PROCESSING SYSTEM FOR DIRECT CONTROL OF A MACHINE IN REAL TIME WITH DISCRETE SIGNALS Ser. No. 291,394 filed on Sept. 22, 1972;

11. DIGITAL ARRANGEMENT FOR PROCESSING SQUAREWAVE SIGNALS Ser. No. 302,771 filed on Nov. 1, 1972;

12. APPARATUS AND METHOD FOR PROVIDING INTERACTIVE AUDIO COMMUNICATION Ser. No. 325,933 filed on Jan. 22, 1973 now U.S. Pat. No. 4,016,540 issued on Apr. 5, 1977;

13. ELECTRONIC CALCULATOR SYSTEM HAVING AUDIO MESSAGES FOR OPERATOR INTERACTION Ser. No. 325,941 filed on Jan. 22, 1973 now U.S. Pat. No. 4,060,848 issued on Nov. 29, 1977;

14. ILLUMINATION CONTROL SYSTEM Ser. No. 366,714 filed on June 4, 1973 now U.S. Pat. No. 3,986,022 issued on Oct. 12, 1976;

15. ILLUMINATION SIGNAL PROCESSING SYSTEM Ser. No. 727,330 filed on Sept. 27, 1976 and now abandoned in favor of continuing applications;

16. CONTROL SYSTEM AND METHOD Ser. No. 339,688 filed on Mar. 9, 1973;

17. DATA PROCESSING SYSTEM Ser. No. 402,520 filed on Oct. 1, 1973 and issuing substantially cotemporaneously herewith;

18. COMPUTERIZED MACHINE CONTROL SYSTEM Ser. No. 476,743 filed on June 5, 1974 and issuing substantially cotemporaneously herewith.

19. HIGH REGISTRATION PHOTOMASK METHOD AND APPARATUS Ser. No. 752,751 filed on Dec. 20, 1976 now U.S. Pat. No. 4,120,583 issued on Oct. 17, 1978; and 20. DIGITAL AUDIONIC SYSTEM Ser. No. 752,240 filed on Dec. 20, 1976 now abandoned in favor of continuing applications:

all by Gilbert P. Hyatt:

wherein the benefit of the filing dates of this chain of copending applications is herein claimed under 35 USC 120, 35 USC 121, and other authorities provided therefor: and wherein the instant application is further related to applications:

21. INTERACTIVE CONTROL SYSTEM Ser. No. 101,449 filed on Dec. 28, 1970 by Lee, Cole, Hirsch, Hyatt and Wimmer now abandoned in favor of a continuing application;

22. ADAPTIVE ILLUMINATION SOURCE INTENSITY CONTROL DEVICE Ser. No. 152,105 filed on June 11, 1971 by Lee, Wimmer, and Hyatt now U.S. Pat. No. 3,738,242 issued on June 12, 1973;

23. ADAPTIVE ILLUMINATION CONTROL DEVICE Ser. No. 325,792 filed on Jan. 22, 1973 by Lee, Wimmer, and Hyatt now U.S. Pat. No. 3,927,411 issued on Dec. 16, 1975;

24. ILLUMINATION CONTROL SYSTEM Ser. No. 327,918 filed Jan. 30, 1973 by Lee, Wimmer and Hyatt now U.S. Pat. No. 3,818,496 issued on June 18, 1974;

25. INTERACTIVE CONTROL SYSTEM Ser. No. 354,590 filed on Apr. 24, 1973 by Lee, Cole, Hirsch, Hyatt, and Wimmer now U.S. Pat. No. 4,038,640 issued on July 26, 1977;

26. MEANS AND METHOD FOR SELECTIVELY CONTROLLING ANIMALS Ser. No. 438,328 filed on Jan. 31, 1974 by Lee and Hyatt now U.S. Pat. No. 3,897,753 issued on Aug. 5, 1975; and 24. DIGITAL SIGNAL PROCESSOR FOR SERVO VELOCITY CONTROL Ser. No. 339,817 filed on Mar. 9, 1973 now U.S. Pat. No. 4,034,276 issued on July 5, 1977: wherein all of the above-mentioned applications are herein incorporated by reference as if fully set forth at length herein. The relationships between the instant application and the above-referenced applications incorporated by reference are apparent based upon the common matter and related matter in the various referenced applications and in the instant application.

In order to facilitate incorporation by reference; the files of said applications Ser. No. 101,881; Ser. No. 134,958; Ser. No. 135,040; Ser. No. 230,872; Ser. No. 232,459; Ser. No. 246,867; Ser. No. 291,394; and Ser. No. 302,771 are hereby opened to the public for the limited purpose of obtaining a copy of the disclosure as-filed but not for obtaining copies of other papers therein.

Copies of said U.S. Pat. No. 3,738,242; U.S. Pat. No. 3,820,894; U.S. Pat. No. 4,060,848; U.S. Pat. No. 3,986,022; U.S. Pat. No. 4,120,583; U.S. Pat. No. 4,121,284; U.S. Pat. No. 4,034,276; U.S. Pat. No. 4,038,640; and U.S. Pat. No. 3,897,753 have been incorporated into the file wrapper of the instant application for convenience of researching the material that is incorporated by reference.

BACKGROUND OF THE INVENTION

1. Field of the Invention

The field of the invention is a machine control system and in particular an illumination control system.

2. Prior Art

Prior art photographic systems have been controlled mechanically, electronically, and in other forms. Computers have been available in the form of core memory based computers. The use of a monolithic computer to control a photographic system is not provided in the prior art.

SUMMARY OF THE INVENTION

The present invention is directed to a monolithic computer-based photographic system and a high registration camera system. A detailed summary of the high registration camera system embodiment is set forth in parent application Ser. No. 752,751 at pages 3 to 6 and in U.S. Pat. No. 4,120,583 issuing thereon at column 2 line 31 to column 4 line 34; which is herein incorporated by reference.

An object of this invention is to provide an improved computerized machine control system.

A further object of this invention is to provide a monolithic computer for machine control.

A still further object of this invention is to provide a system with reduced interface circuits.

BRIEF DESCRIPTION OF THE DRAWINGS

A better understanding of the invention may be had from a consideration of the detailed description hereinafter taken in conjunction with the drawings, as briefly described below.

FIG. 1 is a schematic and block diagram representation of the system of the present invention comprising FIGS. 1A, 1B and 1C wherein FIG. 1A is a schematic and block diagram representation of a machine control system, FIG. 1B is a block diagram representation of a data processor.

FIG. 2 is a schematic and block diagram representation of an operator panel comprising FIGS. 2A and 2B wherein

FIG. 4 is a schematic representation of high registration contact print operations comprising FIGS. 4A-4E showing sequential operations.

Figure 1C:
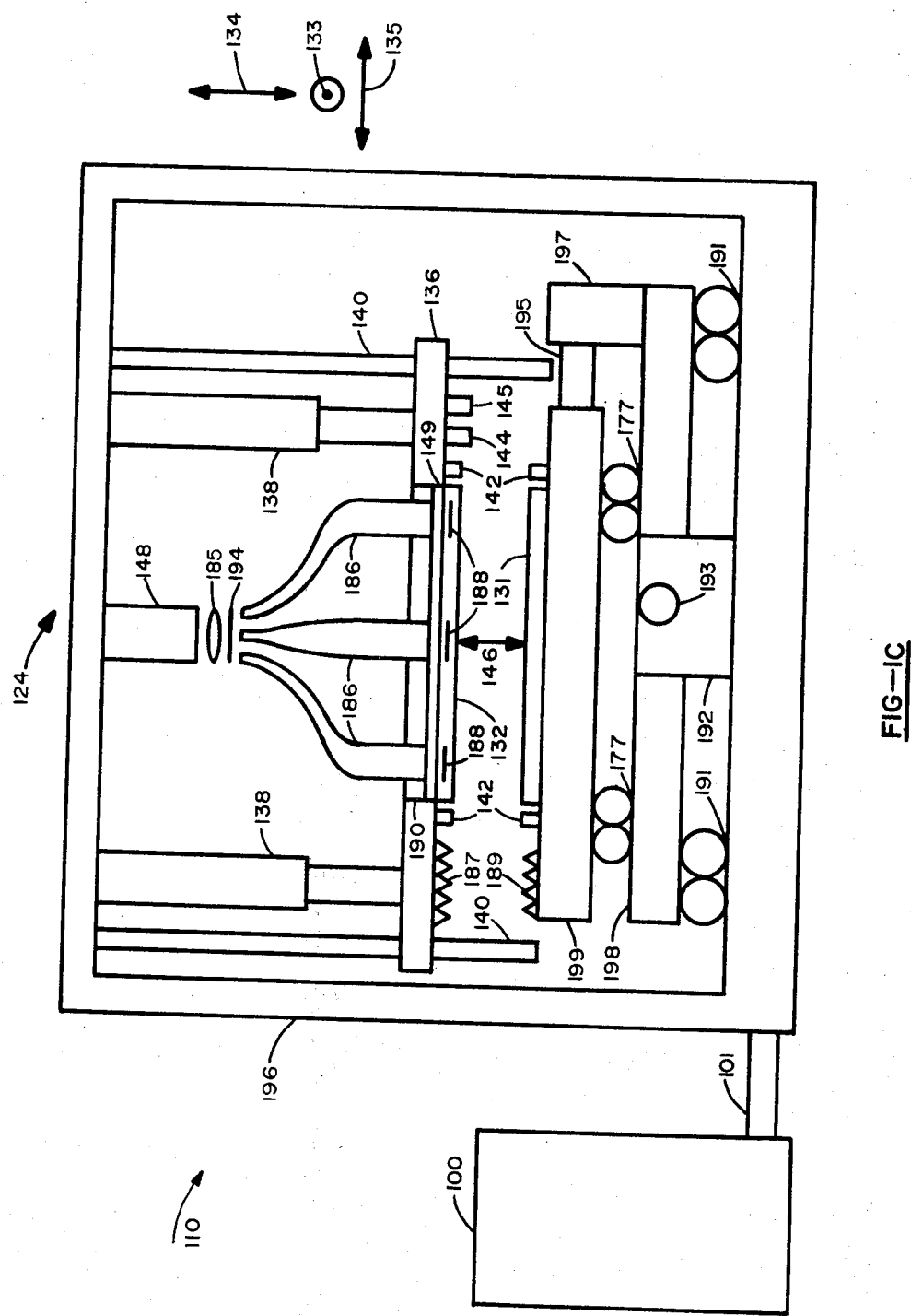
FIG. 1C is a schematic and block diagram representation of a contact print machine.
Figure 2A:
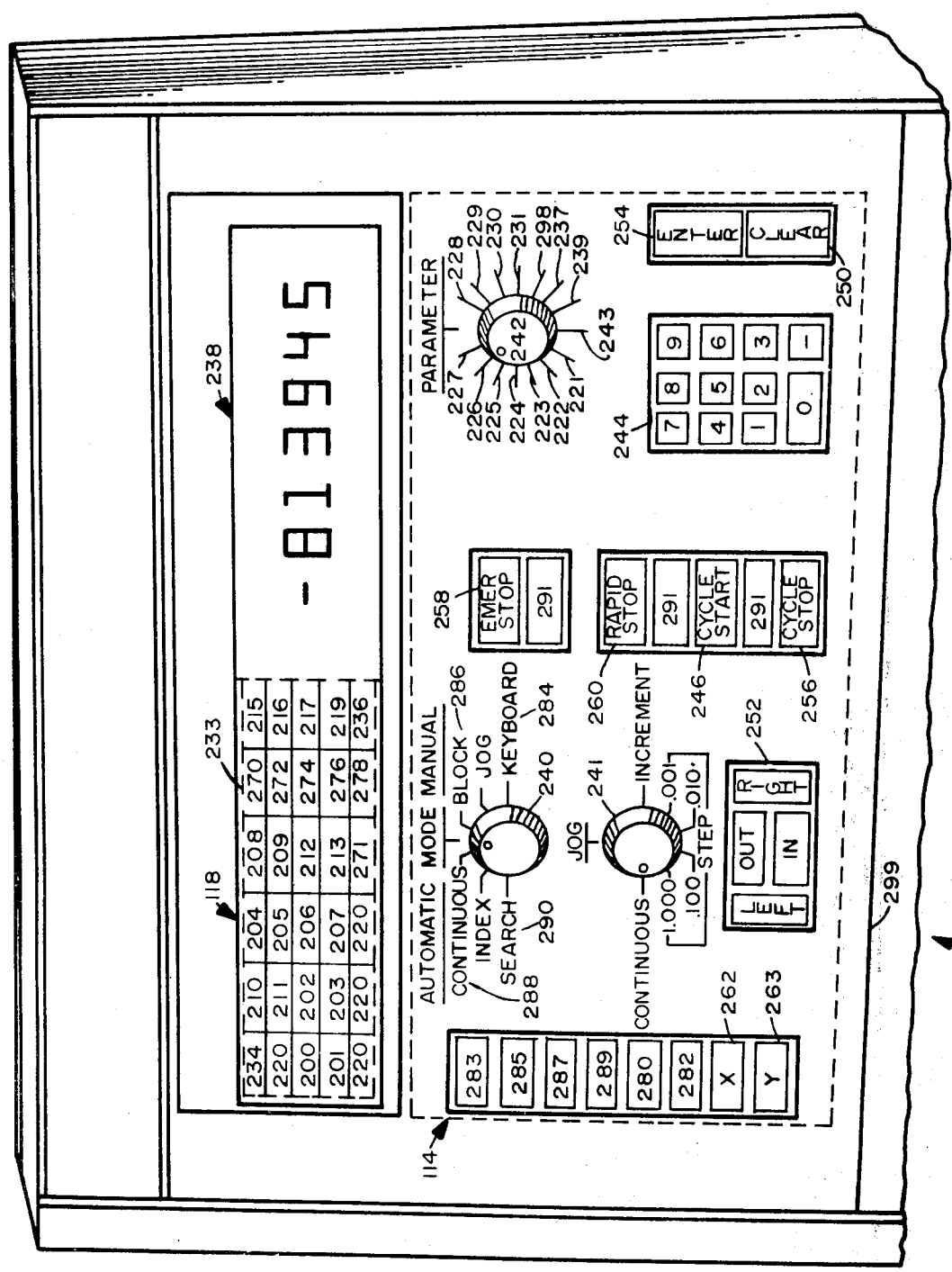
FIG. 2A shows a front view of the operator panel and FIG. 2B shows a front view of the operator panel that is partly broken away and panel circuit components.
Figure 2B:
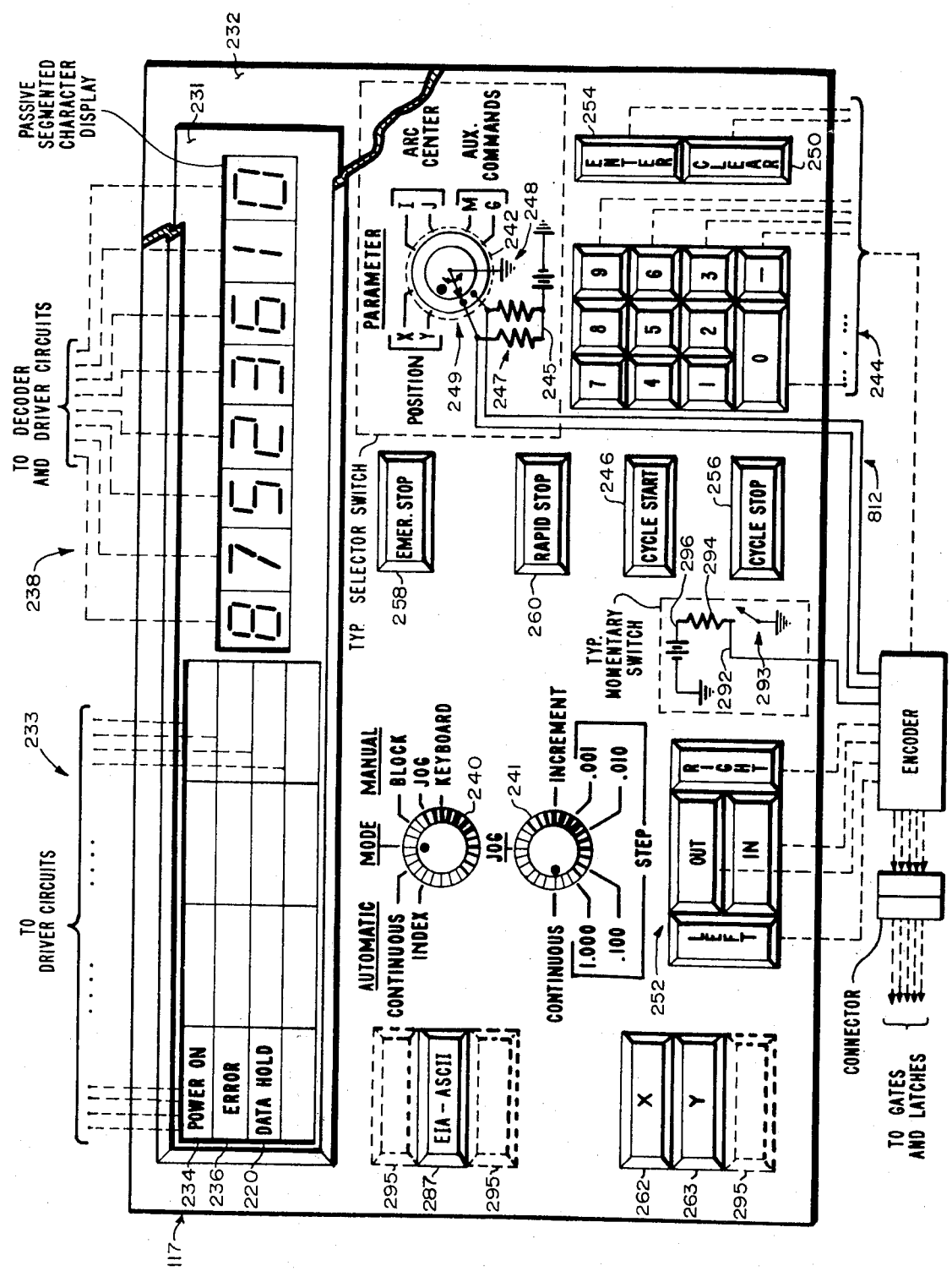

By way of introduction of the illustrated embodiments, the components shown in FIGS. 1 through 9 of the drawings have been assigned general reference numerals and a brief description of each such component is given in the following description. The components in each figure have in general been assigned three digit reference numerals wherein the hundreds digit of the reference numeral is related to the figure number where for example the components in FIG. 1 have reference numerals between 100 and 199 and the components in FIG. 2 have reference numerals between 200 and 299 except that the same component appearing in successive drawing figures has maintained the first reference numeral.

The figures are discussed in detail in the material that is incorporated by reference from related application Ser. No. 752,751 now U.S. Pat. No. 4,120,583.

DETAILED DESCRIPTION OF THE INVENTION

A photographic system can take any one of a number of possible forms. An illustrative embodiment of the present invention is shown in FIGS. 1A-1C and will be described in detail in the parent patent applications. For example, parent application Ser. No. 101,881 discloses a photoplotter illumination control system and parent application Ser. No. 366,714 now U.S. Pat. No. 3,986,022 discloses a photographic camera system and a liquid crystal shutter and aperture arrangement.

A contact print photo-optical embodiment is disclosed in related application Ser. No. 752,751 at page 10 line 8 to page 42 line 21 (now U.S. Pat. No. 4,120,583 at column 5 line 64 to column 21 line 23); which disclosure is herein incorporated by reference.

CONTROL UNIT

A numerical control system embodiment is disclosed in related application Ser. No. 752,751 at page 43 line 2 to page 56 line 31 (now U.S. Pat. No. 4,120,583 at column 21 line 26 to column 28 line 13); which disclosure is herein incorporated by reference.

The CNC system of the present invention is represented in block diagram form in FIG. 1A as a numerical control system 110, including an electronic data processor 112, arranged in accordance with the invention. A specific example referred to here and described hereafter relates to a multi-axis controlled machine, but it will readily be appreciated that systems in accordance with the invention may be applied to a wide variety of tasks including communication, process control, processing of business data and other control functions such as photo optical pattern generators and multi-turret machines.

In accordance with the basic concepts of a factored electronics system, the numerical control system (FIG. 1A) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 112 and the various extremities that communicate with the data processor through this input-output structure.

The data processor 112 is shown by way of this example to be used in conjunction with a main memory 130. The basic architecture of this data processor will permit an integrated circuit memory, such as a read-only memory (ROM), or a random-access memory (RAM) or flip-flop type memory to be substituted for the main memory 130, which might be called a monolithic computer.

The architecture of the computer is oriented towards a factored computer system to permit the data processor to operate in close conjunction with the extremities for this factored computer system. The special organization and instruction repertoire aid in implementing this factored computer system.

The operator panel 117 operates with the data processor in a mutually interdependent fashion to yield interactive capability for operator functions.

The photoelectric tape reader 116 is an extremity that inputs programs to define a part for the machine 124. The real time non-adapted signal form intrinsic to the tape reader 116 includes not only data but tape reader characteristics caused by photo-optical, electro-mechanical, and electrical effects that are inherent to the tape reader. The data processor accepts these intrinsic signal forms directly from the tape reader and derives the required data from the ambiguity and errors present in this intrinsic signal form.

The machine 124 may be an extremity of the system which can be implemented as an elemental extremity in conjunction with the data processor. Direct control of the various machine operations, such as storing the tool positions, compensating for tool characteristics, and controlling a turret motor for tool selection, reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 120, 121, 122 are a typical example of elemental extremities. The communication between the data processor and the axes servos is in a signal form wherein the whole number aspect is intrinsic to the data processor and wherein the square-wave aspect is intrinsic to the axes servos. This intrinsic signal form simplifies the communication interface between the data processor and the axes servos and relieves limitations previously imposed on servos for numerically controlled machines.

System implementation and operation is disclosed in related application Ser. No. 752,751 at page 59 line 6 to page 72 line 17 (now U.S. Pat. No. 4,120,583 at column 29 line 20 to column 35 line 52); which disclosure is herein incorporated by reference.

DATA PROCESSOR DESCRIPTION

As shown in FIG. 1A, the data processor 112 receives data from the various input sources, performs calculations or otherwise manipulates data in accordance with the input information and outputs processed information to control the machine 124 through servos 120, 121 and 122 and auxiliary control signals 126. The data processor is built from series SN7400 integrated circuits manufactured by Texas Instruments, Inc. which are located on a series of printed circuit boards. These printed circuit boards plug into a Mother board which provides necessary interconnections between the terminals of the printed circuit boards.

The data processor of the present invention is discussed in detail herein; is discussed in further detail in the material that is incorporated by reference from parent application Ser. No. 246,867 issuing cotemporaneously with the instant application; is discussed in still further detail in the material that is incorporated by reference from parent application Ser. No. 232,459 issuing cotemporaneously with the instant application; and is discussed in further detail in the material that is incorporated by reference from parent application Ser. No. 101,881 copending with the instant application.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor wherein the digital portion is constructed wholly of integrated circuit components.

A general purpose data processor is provided which is fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this data processing system.

The data processor 112 is organized to process 8 bit words with most working and storage registers having a 16 bit capacity permitting the storage of two words. Serial transfer of data is used throughout the data processor 112 to minimize the control logic required.

In a simplified block diagram, the data processor 112 is shown in FIG. 1B as control logic 102 interconnecting registers, timers and communication channels.

The data processor is disclosed in related application Ser. No. 752,751 at page 74 line 4 to page 80 line 33 (now U.S. Pat. No. 4,120,583 at column 36 line 26 to column 39 line 47); which disclosure is herein incorporated by reference.

OPERATOR PANEL

The operator panel is disclosed in related application Ser. No. 752,751 at page 81 line 2 to page 107 line 13 (now U.S. Pat. No. 4,120,583 at column 39 line 50 to column 53 line 7); which disclosure is herein incorporated by reference.

The operator panel is further discussed in detail in the material that is herein incorporated by reference from U.S. Pat. No. 4,121,284 and U.S. Pat. No. 4,038,640.

NUMERICAL CONTROL OPERATIONS

Various machine control capabilities including operator panel; tape control; feedrate control; motion resolution, conversion and scaling; dimensioning; tool offsets; tabular memory control; acceleration and deceleration control and rotary axis capabilities are disclosed in related application Ser. No. 752,751 at page page 108 line 2 to page 143 line 6 (now U.S. Pat. No. 4,120,583 at column 58 line 10 to column 73 line 18); which disclosure is herein incorporated by reference.

CNC COMMAND ARRANGEMENT

A CNC command arrangement is disclosed in related application Ser. No. 752,751 at page 144 line 2 to page 160 line 6 (now U.S. Pat. No. 4,120,583 at column 73 line 21 to column 81 line 34); which disclosure is herein incorporated by reference.

MACHINE INTERFACE

A machine interface arrangement is disclosed in related application Ser. No. 752,751 at page 161 line 2 to page 170 line 28 (now U.S. Pat. No. 4,120,583 at column 81 line 37 to column 85 line 68); which disclosure is herein incorporated by reference.

SWITCH CONTROL

Switch control operations are disclosed in related application Ser. No. 752,751 at page 171 line 2 to page 177 line 9 (now U.S. Pat. No. 4,120,583 at column 86 line 3 to column 89 line 23); which disclosure is herein incorporated by reference.

Switch signal processing is described in detail in parent application Ser. No. 288,247 now U.S. Pat. No. 4,121,284; particularly relative to FIG. 6 therein.

MACHINE INTERFACE OPERATIONS

Machine interface operations are disclosed in related application Ser. No. 752,751 at page 178 line 2 to page 195 line 5 (now U.S. Pat. No. 4,120,583 at column 89 line 40 to column 98 line 2); which disclosure is herein incorporated by reference.

The system of the present invention has broad applicability to control of physical systems. In a preferred embodiment, control of a high registration contact print machine and a machine tool have been described in detail to exemplify the present invention. Still further, an automobile control embodiment has been described to illustrate another application of the present invention. The broad scope of the present invention will be further illustrated with an embodiment that may be used in a home or other building.

System 110 may be used by a businessman or home occupant to control machines commonly found in a business establishment or in a home. In a business establishment, machine 124 may be a dictating machine, a limited access control, an elevator control, or other well known machines contained in the business establishment. In a home embodiment, machine 124 may be a washing machine, a dryer, an oven, a refrigerator, a dishwater, a television, an alarm such as a fire alarm or burglar alarm, or other well known machines common in homes. The system of the present invention may be used to control a single machine or a combination of machines to perform their respective operation. In a preferred embodiment, system 110 has been described for controlling a plurality of operations associated with a single machine. In other embodiments, system 110 may control a plurality of operations associated with more than one machine which may include different types of machines.

The system has been described for a particular group of extremities or peripherals such as devices 150-158, 114, and 118 for a machine control system embodiment. Other extremities or peripherals may be used with the system 110 to adapt this system to the particular requirements of the application. For example, CRT 158 may be a well known television set controlled to provide alpha-numeric messages or graphic displays under control of system 110. Further, the peripherals or extremities discussed in detail for system 110 above may be adapted to the requirements of the particular application. For example, operator panel 117 has been described in an embodiment for a machine control system and the versatility of this panel configuration has been described for general applications where the switches and displays are under control of a data processor operating under program control. Therefore, the operation of each element on panel 117 may be adapted to a particular application primarily by re-programming the data processor. Further, the legends associated with each switch and display may be changed and the layout of the panel may be changed to meet the requirements of a particular application using techniques well known in the art. For example, legends may be provided with silk screen or photographic processes, switches may be relocated by changing the well known printed circuit board or wire bundle interconnections on the panel back plane in conjunction with providing mounting holes in different portions of the panel, and displays may be added or removed and may be located in different areas of the panel as required by the particular application, implemented by using the teachings of the present invention. Further, the panel 117 is exemplary of a generalized input and output arrangement, where the switches may be operator actuable with a hand such as for the embodiment shown in FIG. 2A, by a foot such as with an automobile brake pedal, or with other actuation arrangements. Further, the arrangement discussed for lamp displays 233 and numeric displays 238 can similarly be used to control other devices such as machine actuators, automobile headlights, and other well known devices.

Figure 3B:
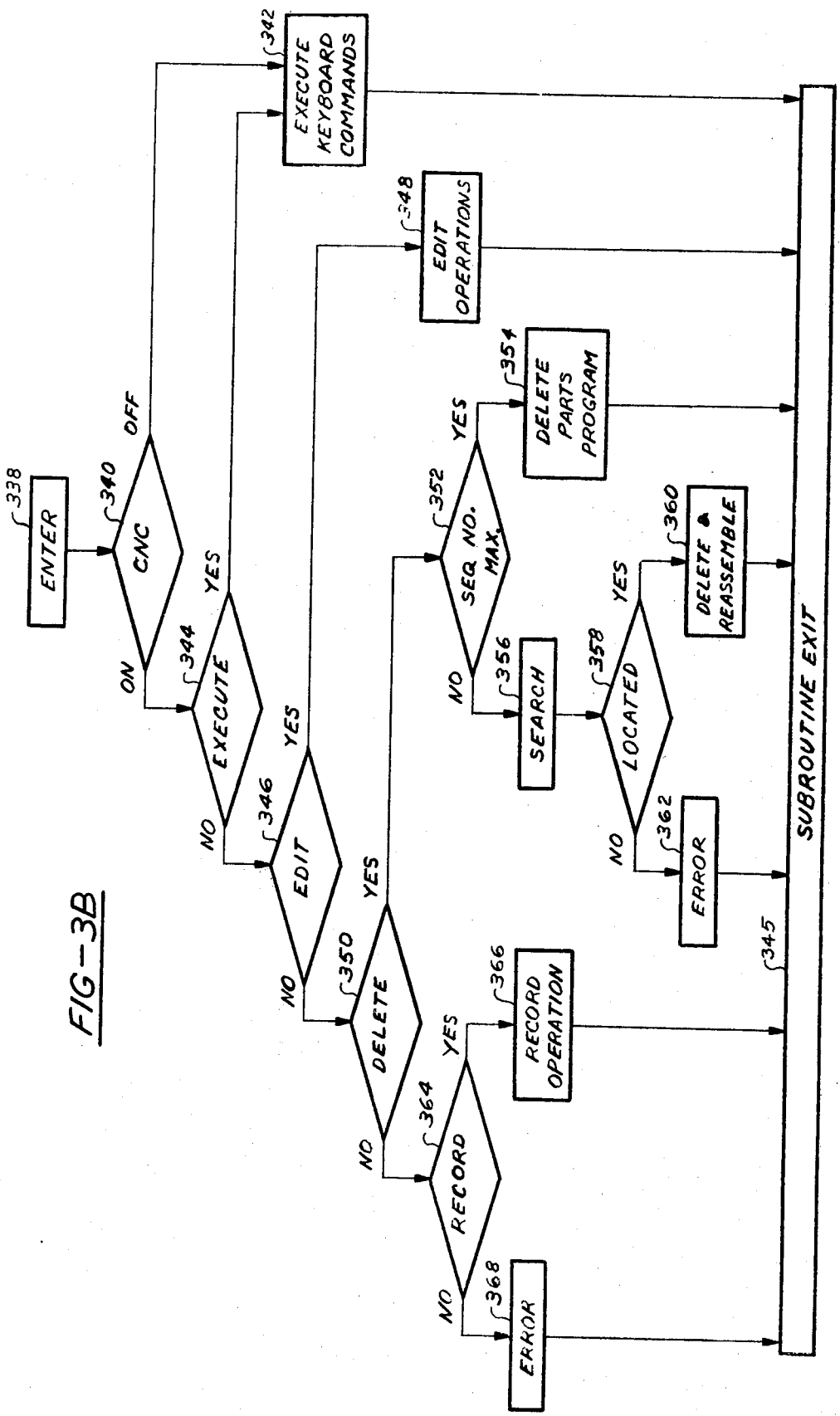
FIG. 3 is a flow diagram representation of system operations comprising FIGS. 3A-3G showing flow diagrams of various system operations.
Figure 3D:
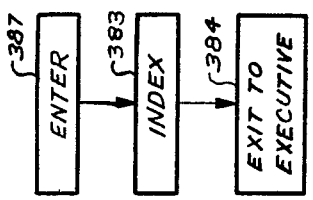
Figure 3E:
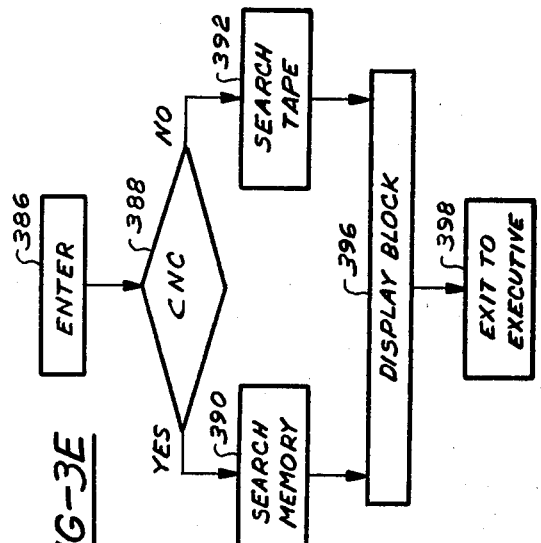
Figure 3C:
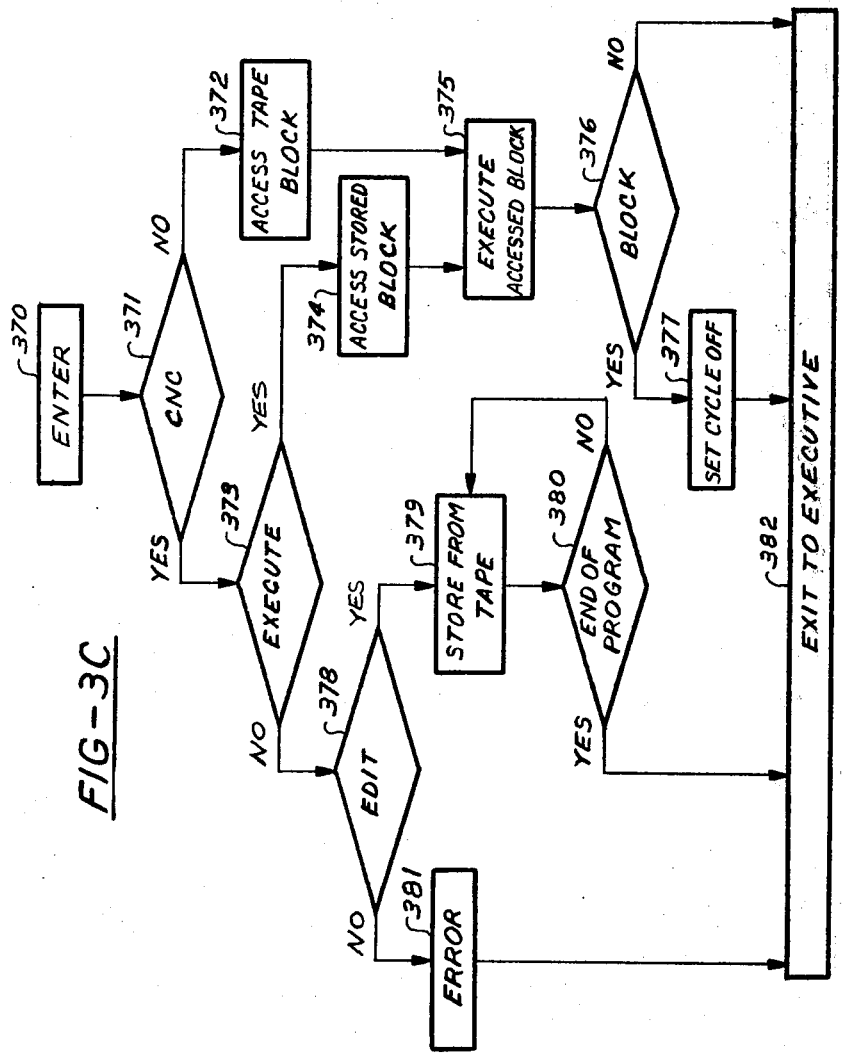
Figure 3G:
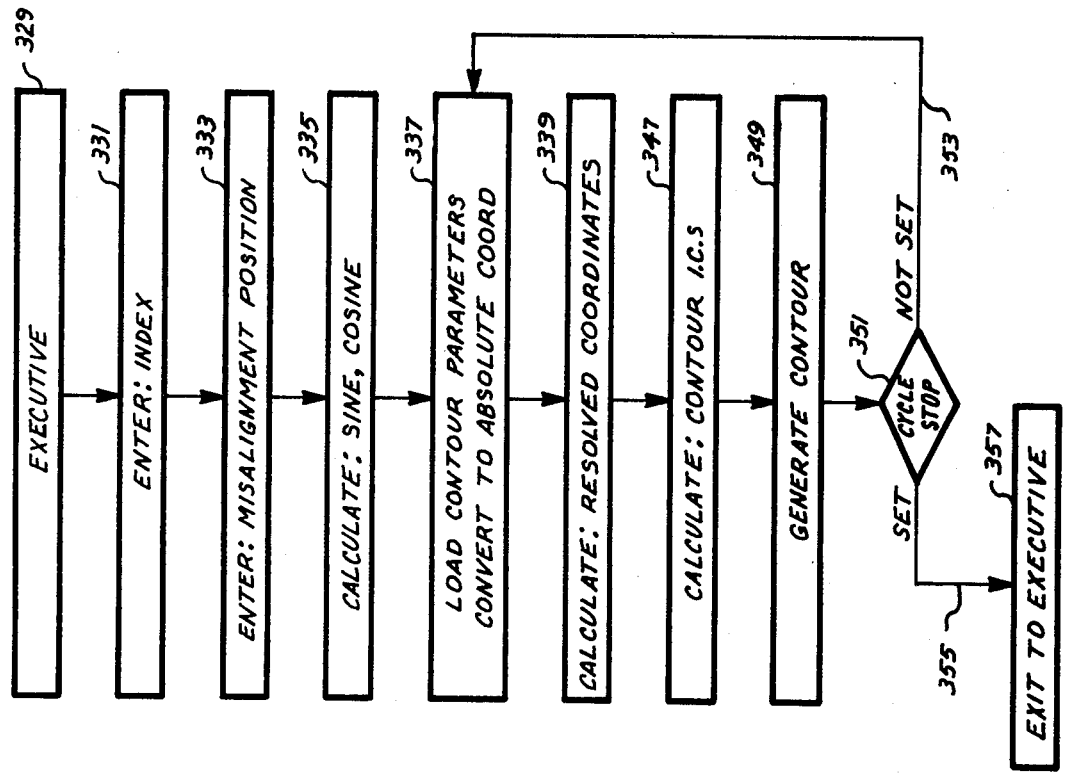
Figure 3F:
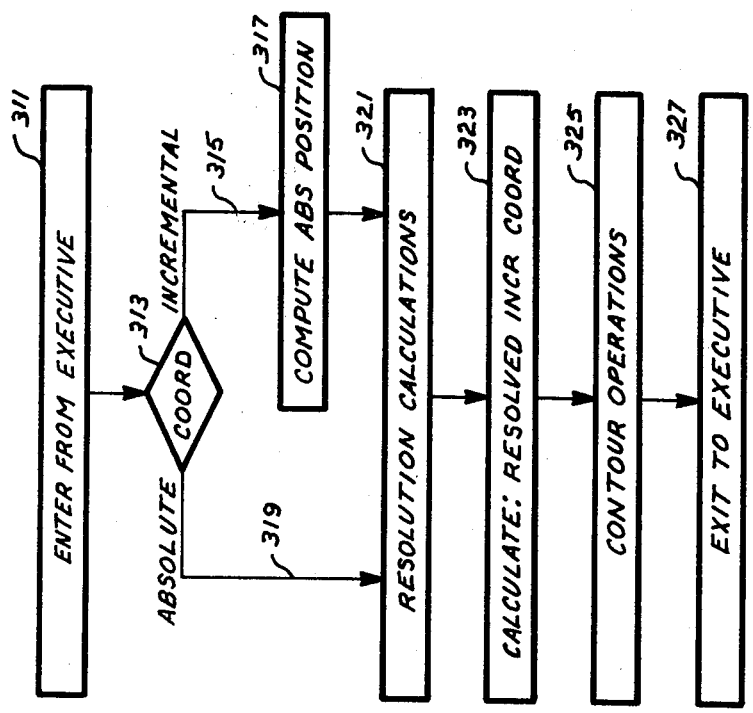

The mode control logic discussed with reference to flow diagrams shown in FIGS. 3A-3E may control different modes of operation. For example; keyboard subroutine 326 may be used to permit an operator to manually enter commands for many different types of machines or other systems; block subroutine 328 may be used to permit an operator to control a machine or other system in a semi-automatic manner; continuous subroutine 330 may permit an operator to control a machine or other system in an automatic manner; and index subroutine 332 may be used to permit an operator to control a machine or other device to enter a predetermined condition, which may be an initial condition; search subroutine 334 may be used to permit an operator to control a machine or other system by searching for information and programs; and error subroutine 336 may be used as a generalized operator feedback indication on system performance, status, and other conditions. The flow diagram shown in FIG. 3B is exemplary of a subroutine for permitting an operator to manually control or change the operation of a machine or other device. Similarly, FIGS. 3C-3E are exemplary of subroutines that may be used to control many different types of machines or systems. Further, the subroutines shown in FIGS. 3F and 3G illustrate computational operations for simplifying operation of machines by resolving coordinates, converting between coordinate systems, eliminating misalignments and other such undesirable characteristics and exemplifying other computational capabilities. It will become obvious to those skilled in the art from the teachings of the present invention that the flow diagrams set forth in FIGS. 3A-3G; having been described for a numerical control embodiment to exemplify the features of the present invention; are adaptable to many different types of control operations.

In a control system embodiment having existing wiring, such wiring may be shared between the original signals carried by the wiring and by the control signals; thereby further enhancing system economy. In one example, AC power plugs and interconnections in a home embodiment are available in virtually every room and may be used for communicating control signals. Further, electrical machines are typically plugged into the power system. Therefore, the AC power distribution network may be shared with control signals to provide a communication system for machine control. For example, signals 126 such as command signals 126A can be communicated between the data processor 112 and the machine 124 by modulating a carrier and impressing this carrier on the AC power distribution line. Machine 124 may include a well known coupler and demodulator to receive the digital signals transmitted on the power network.

Communication through the power distribution system is well known in the intercom art for communicating voice information. Therefore, communication of digital information can be provided in the same manner. Digital information is easier to transmit than voice information, where digital information involves only two states and the voice information involves a continuous amplitude spectrum, as is common with analog signals. Therefore, well known prior art power line modulation arrangements may be used to provide the communication capability described herein.

Therefore, transmission device 127 may be a well known arrangement including devices for modulating a high frequency carrier (such as 10KHz to 100KHz) with digital signals and for coupling the modulated signals onto the power line such as with a coupling transformer at the transmission source and including devices for coupling the signals off of the power line at the destination such as with a coupling transformer and for demodulating signals at the destination to obtain the transmitted digital information. An embodiment is discussed herein for transmitting information on a single transmission line for a teletypewriter arrangement and for a machine communication arrangement, where the transmission and receiving of self-synchronizing signals are discussed in detail therewith for a preferred embodiment and is known in the art for prior art embodiments. Therefore, self-synchronizing data may be transmitted between systems 100 and machine 124 using a single pair of power transmission lines without the need for clock signals. As an alternate embodiment, data and clock signals may each modulate different subcarrier frequencies, where both the data subcarrier and the clock subcarrier may be impressed upon the power line, received at the destination and demodulated to provide separate data and clock signals. A data transmission arrangement using a gated clock signal is discussed herein for the data pipe shift register embodiment and for the gated clock arrangement of the present invention.

Figure 5A:
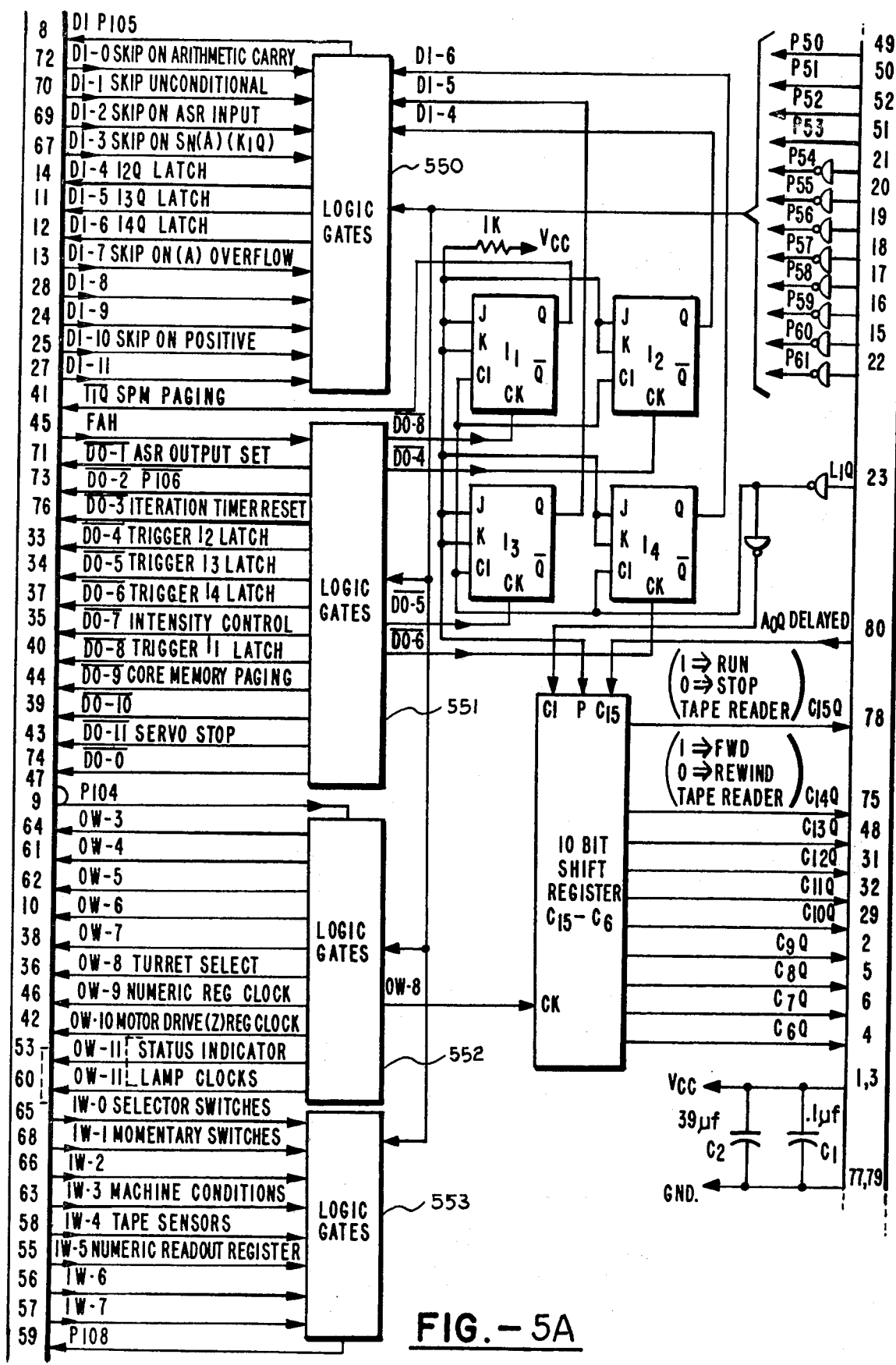
FIG. 5 is a schematic and block diagram representation of the system IFA comprising FIG. 5A showing IFA-1 logic, FIGS. 5B and 5C showing IFA-2 logic, and FIG. 5D showing the form in which FIGS. 5B and 5C connect together.
Figures 5B, 5D:
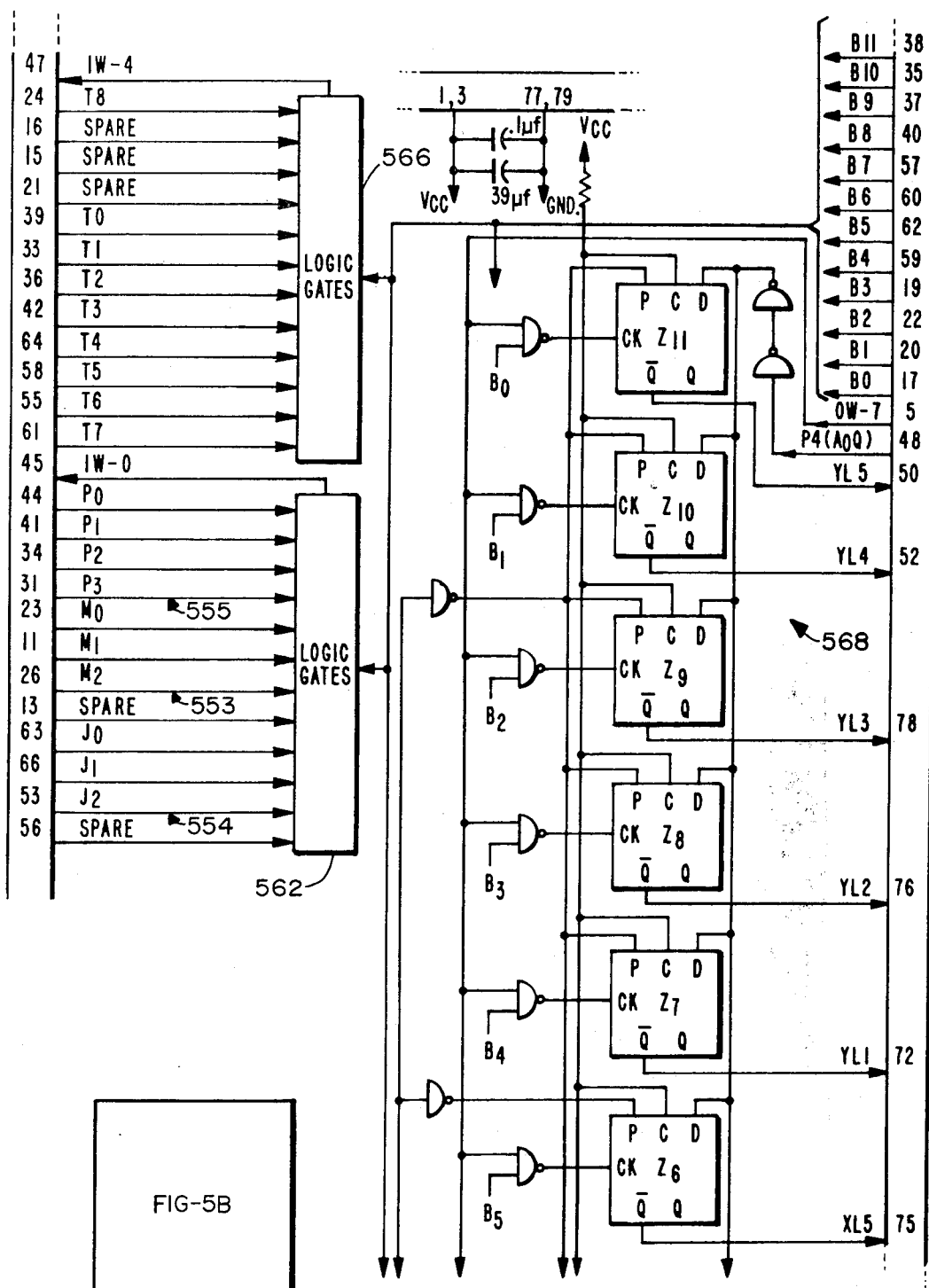
Figure 5C:
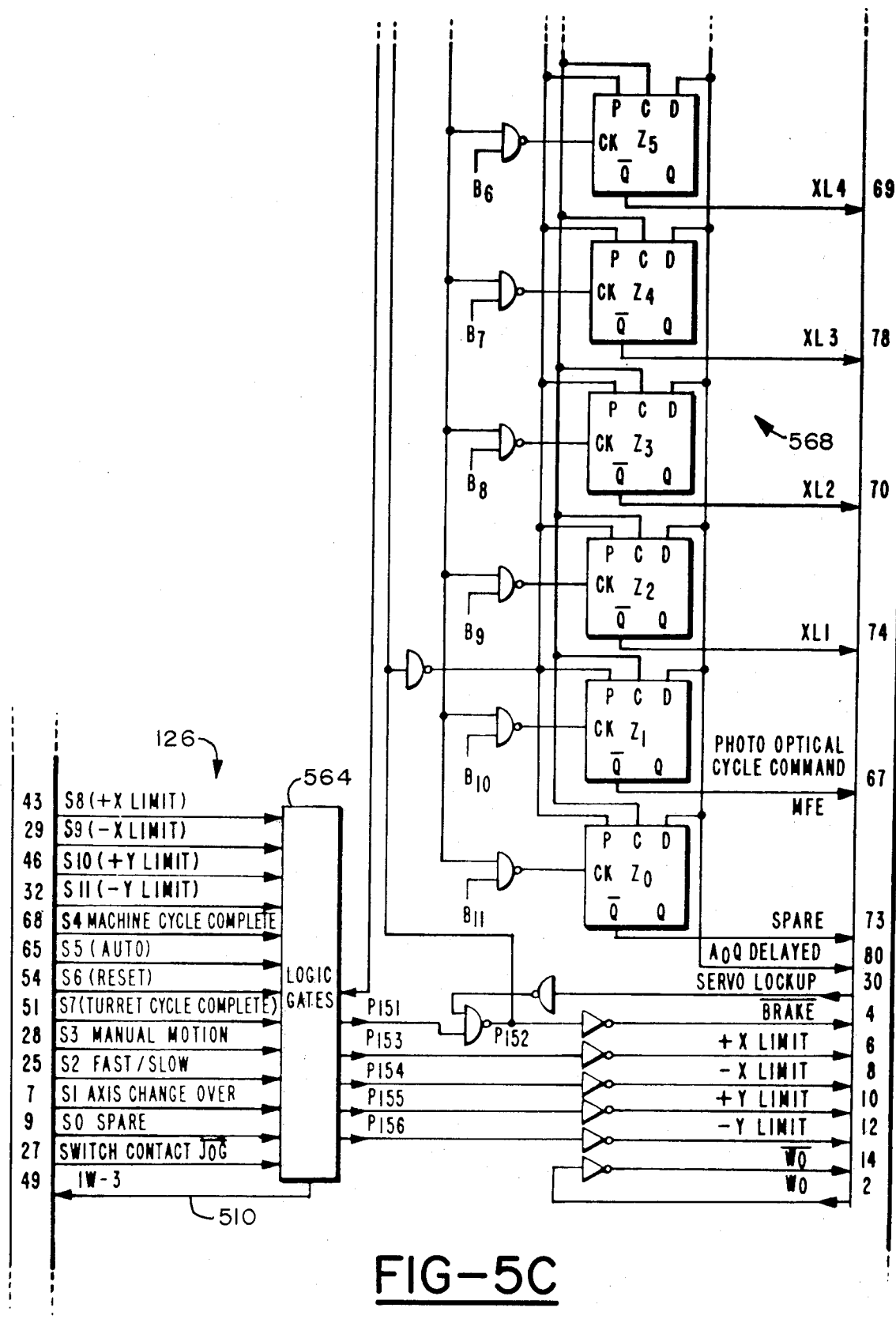

The interface arrangement set forth in FIGS. 5A–5D, 9A, and 9B have been described for a machine tool embodiment to exemplify the present invention. It is herein intended that the machine tool embodiment be exemplary of the broad scope of the present invention for controlling physical systems and, in particular, various types of machines. For example, the tape reader control signals in the C-Register 560 can be used to control other machines such as a washing machine. The C15Q signal may be used to start and stop the wash cycle, the C14Q signal may be used to start and stop the spin cycle, and signals C14Q–C16Q may be used to control various other machine devices such as a pump, a hot water intake valve, a cold water intake valve, and various other devices exemplified by the machine. Further, as discussed for a machine tool embodiment, C-Register 560 may be physically mounted in the machine 124 and may be loaded from transmitted information which may be transmitted over the power lines as discussed above. Logic gates 552 are provided for gating other clock signals to other shift registers for shifting the AOQ signal into such other registers, as illustrated in FIG. 5A for the C-Register 560. Similarly, input information is obtained by shifting data from such other registers with the gated clock signals obtained from logic gates 552 through logic selection gates 553 into an input register such as the A-Register in the data processor. Still further, discrete outputs to machine 124 such as DO signals from logic gates 551 and discrete input signals such as DI signals into logic gates 550 provide control and machine communication. Yet further, parallel input logic 562, 564 and 566 and parallel output register 568 may be used to control other types of machines. Although the machine input signals 126 to logic gates 564 have been described for a machine tool embodiment, it is herein intended that these signals be usable for other types of machines such as the washing machine described herein. Still further, select decode 680 has been described for a turret select but may also be used for a mode select such as for a washing machine to control the solenoids and actuators for controlling devices generating operations such as wash modes, spin modes, drying modes, and other such operations.

Figure 9A:
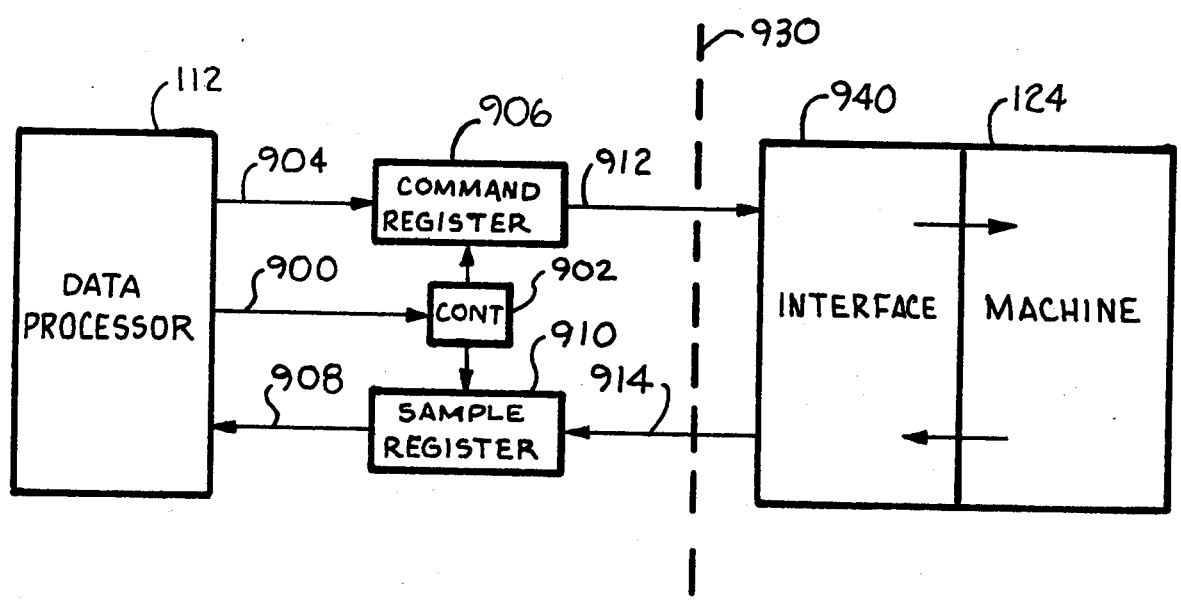
FIG. 9 is a schematic and block diagram representation of an arrangement for communication between a data processor and a machine comprising FIGS. 9A and 9B showing different embodiments of the communication arrangement.
Figure 9B:
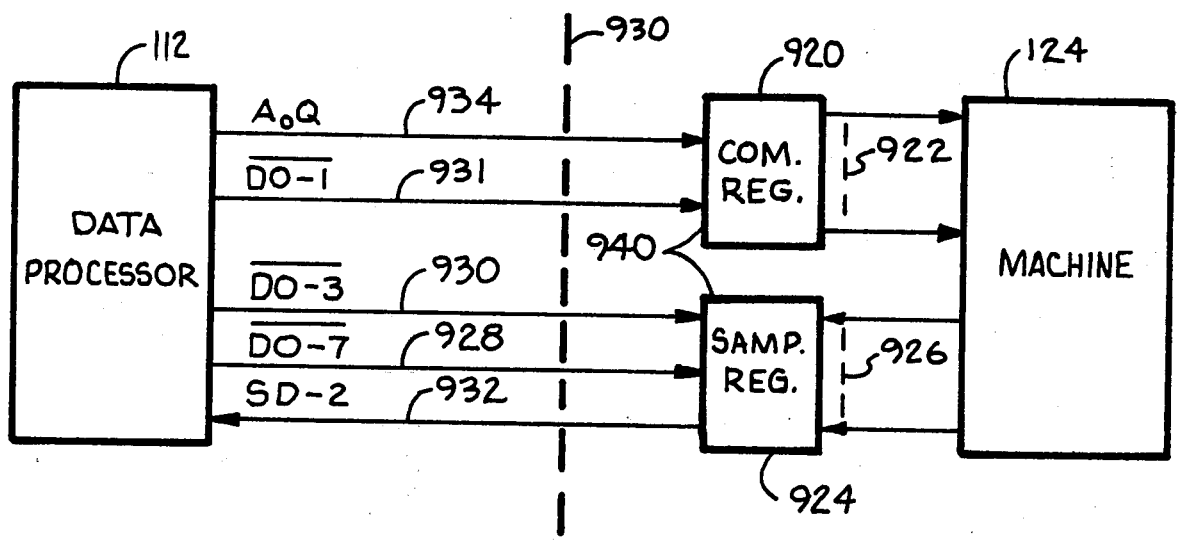

The interface arrangement shown in FIGS. 9A and 9B may be used with a machine such as a washing machine wherein interface 940 may include the power line transmission arrangement discussed above. Command registers 906 and 920 and sample registers 910 and 924 may be configured in various arrangements to implement an interface with other types of machines such as a washing machine. Yet further, the generation of a sequential stream of control signals has been described above with reference to FIGS. 9A and 9B exemplary of a self-synchronizing data stream such as might be usable on a single transmission line arrangement like an AC power line.

The flow diagrams of system operations set forth in FIGS. 3A–3G and 8A–8C are applicable to a general machine arrangement such as a washing machine arrangement. Although the flow diagram set forth in FIG. 3B has been described with reference to a spindle of a lathe, it is applicable for control of another machine operation such as for control of the rotating element in a washing machine, for control of the shaft of an automobile, and, consistent with the broad scope of the present invention, for control of operation of a generalized machine element with various sequencing and control operations.

The elements and cooperation between elements described for the embodiments of the present invention are discussed herein for a preferred embodiment to exemplify the inventive features, where these inventive features are intended to be generally applicable based upon the broad scope of the present invention. Further, many of the features have been described independently for simplicity. It is herein intended that the various features discussed shall be usable in combination to provide a system with various combinations of these features. For example, a control panel has been described for one embodiment, a machine interface has been described for a second embodiment, and transmission line communication with a washing machine has been described for a third embodiment. It is herein intended that the control panel, interface communication, transmission line arrangement, and washing machine be combinable in an embodiment using combinations of the features described herein. Similarly, any features described with respect to one preferred embodiment are intended to be equally usable in various combinations therebetween and in other embodiments, wherein the structure and operation for other combinations and with other embodiments will become obvious to those skilled in the art from the teachings of the present invention.

MACHINE AND CONTROL UNIT COMMUNICATION

Transmission of data through cabling and across an interface may cause problems for high speed digital data. Therefore, an arrangement is discussed that provides low frequency data and clock signals between a computer 112 and an interface register. These low frequency data channels can be provided with various arrangements such as (1) auxiliary registers and (2) discrete input and discrete output computer instructions.

In prior art computers, data transfers are performed in parallel to enhance computer speed. Also, in prior art machine control systems, the machine condition signals 126B are communicated between the machine 124 and the control 100 in parallel data form. Parallel data transfers require an excessive number of lines and associated electronics such as line receivers and line drivers. Therefore, a preferred embodiment of this invention uses serial data transfers between electronic subsystems and also provides a serial data transfer arrangement between the control subsystem and the machine. Serial data transfers are intended to mean sequential data transfers of a plurality of bytes, where the preferred embodiment discussed herein provides serial data transfers of sixteen single-bit-bytes per word.

The auxiliary register embodiment, illustrated in FIG. 9A, provides buffer registers 906 and 910 that are loaded at a first data rate and unloaded at a second data rate. For example, computer output command words 904 are loaded into the auxiliary register 906 at the high computer clock rates and are unloaded at low interface clock rates while computer input sample words 908 are loaded into the auxiliary register 910 at the low interface clock rates and are unloaded at the high computer clock rates. The data processor 112 provides command signals 900 to an auxiliary register control 902 to control the transfer of high data rate output command words from the computer 112 along line 904 to the command register 906 and to control the transfer of high data rate input sample words from the sample register 910 along lines 908 to the computer 112. Also, the auxiliary register control 902 controls the transfer of low data rate output command words from the command register 906 to the machine interface 302 along lines 912 for machine control and also the transfer of low data rate input sample words from the interface 302 to the sample register 910 along lines 914 to define machine conditions.

This auxiliary register interface embodiment can be the same as described for the servo commands in the parent applications, where the computer loads servo commands into the auxiliary $\Delta$ register and/or unloads servo data from the auxiliary $\Delta$ register, then generates a discrete output instruction such as a DC-13 instruction to initiate the off-line operations at the servo clock rates.

For parallel computer input/output structures, the operation of parallel-to-serial and serial-to-parallel conversions can also be provided with the auxiliary registers 906 and 910 in addition to the data rate conversion for the communication function.

Discrete output and discrete input instructions can be used to communicate with an interface register in much the same manner as discussed for the 110 baud auxiliary channel for communication with a typewriter described in the parent applications.

For this interface embodiment, the computer 112 will clock the selected interface register with a discrete output, which can be used in place of the previously discussed OW-8 clock signal, to load each command bit into that interface register, which may be the $A_oQ$ bit as described for the typewriter embodiment, and/or to make a new bit available at the output of that interface register which can be sampled with a discrete input instruction.

This embodiment is illustrated in FIG. 9B. The interface command register 920 is used to provide command conditions 922 to the machine 124 and the interface sample register 924 is used to sample machine conditions 926 and provide these conditions to the computer 112.

The computer 112 initiates an input sample operation with a discrete output instruction which generates a DO-7 command pulse 928 to command the loading of the machine conditions 926 into the interface sample register 924; then the computer 112 clocks the sample register 924 with discrete output instructions which generate DO-3 command pulses 930. The computer samples the output 932 of the sample register 924 with a skip-on-discrete-2 (DJ-2) instructions after each discrete output clock instruction and packs the new machine sample condition 932 into a machine sample word under program control. The computer 112 samples all of the machine conditions in register 924 in sequence in this manner.

The computer 112 initiates an output command operation by packing the discrete command conditions into a discrete command word, then loading this packed discrete command word into the interface command register 920. This loading operation is performed by placing the command word in the A-Register so that the least significant bit of the A-Register ($A_oQ$) 934 is presented as the input to the command register 920, then executing a discrete outut $-1$ instruction which generates a DO-1 command pulse 931 to clock the register 920 to shift-in the $A_oQ$ 934 command bit. The computer then executes a shift right instruction to place the next command bit in the $A_oQ$ position and then sequentially executes combinations of discrete output $-1$ instructions and shift right instructions until the command word in the A-Register has been clocked into the command register 920.

In another embodiment, the discrete output $-3$ (DC-3) pulse 930 can simultaneously clock both, the command register 920 and the sample register 924 to simultaneously input a sample bit and output a command bit. The computer 112 interleaves the input sample operations and the output command operations as will be obvious to those skilled in the art.

It can be seen with reference to FIGS. 9A and 9B that a low data rate interface 930 and serial multiplexed communication exists for each embodiment discussed, thereby providing the advantages of few interconnections and low data rate signals between the computer subsystem 112 and the machine subsystem 124.

Figure 6:
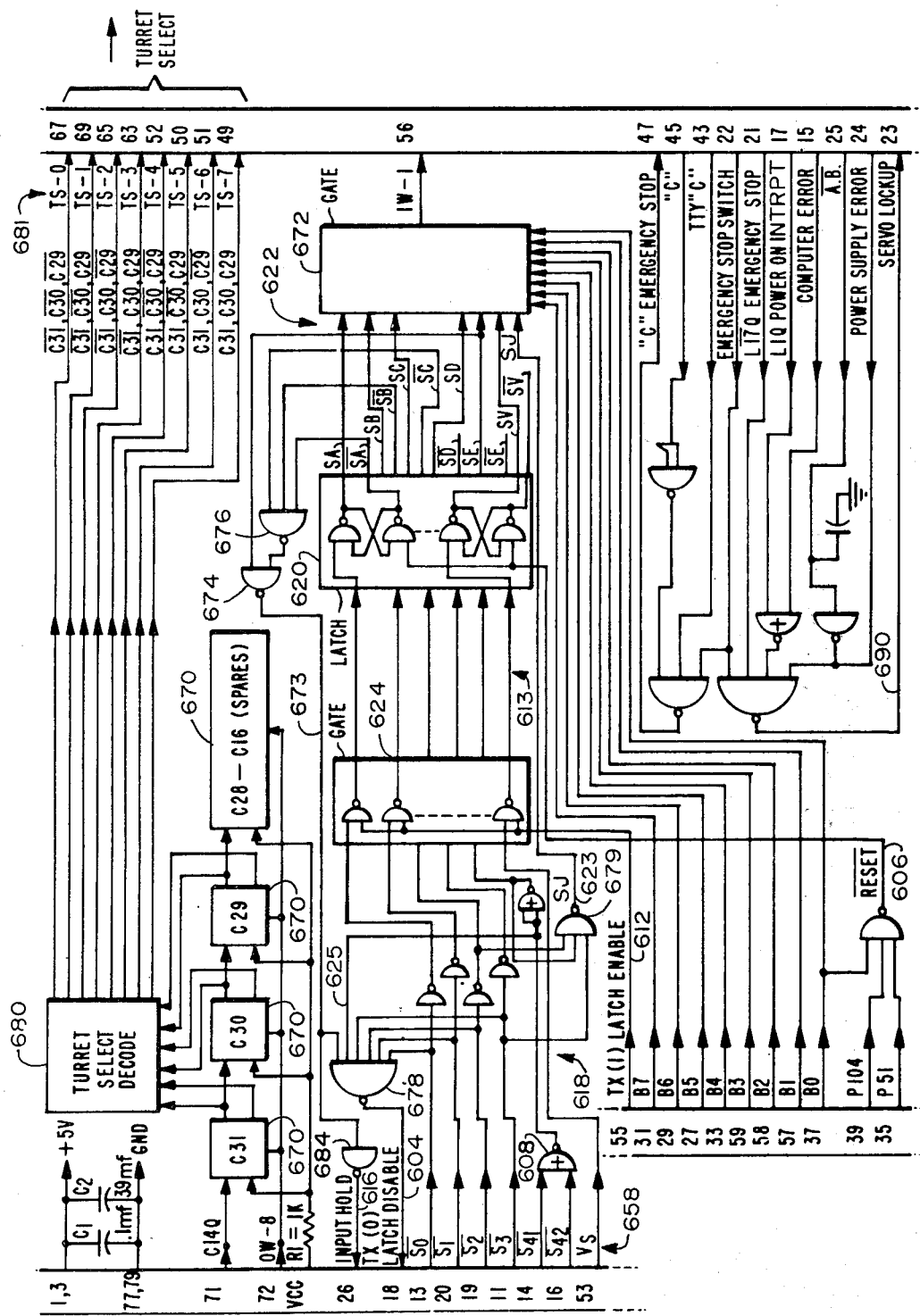
FIG. 6 is a schematic and block diagram representation of IFA-3 logic.
Figure 7A:
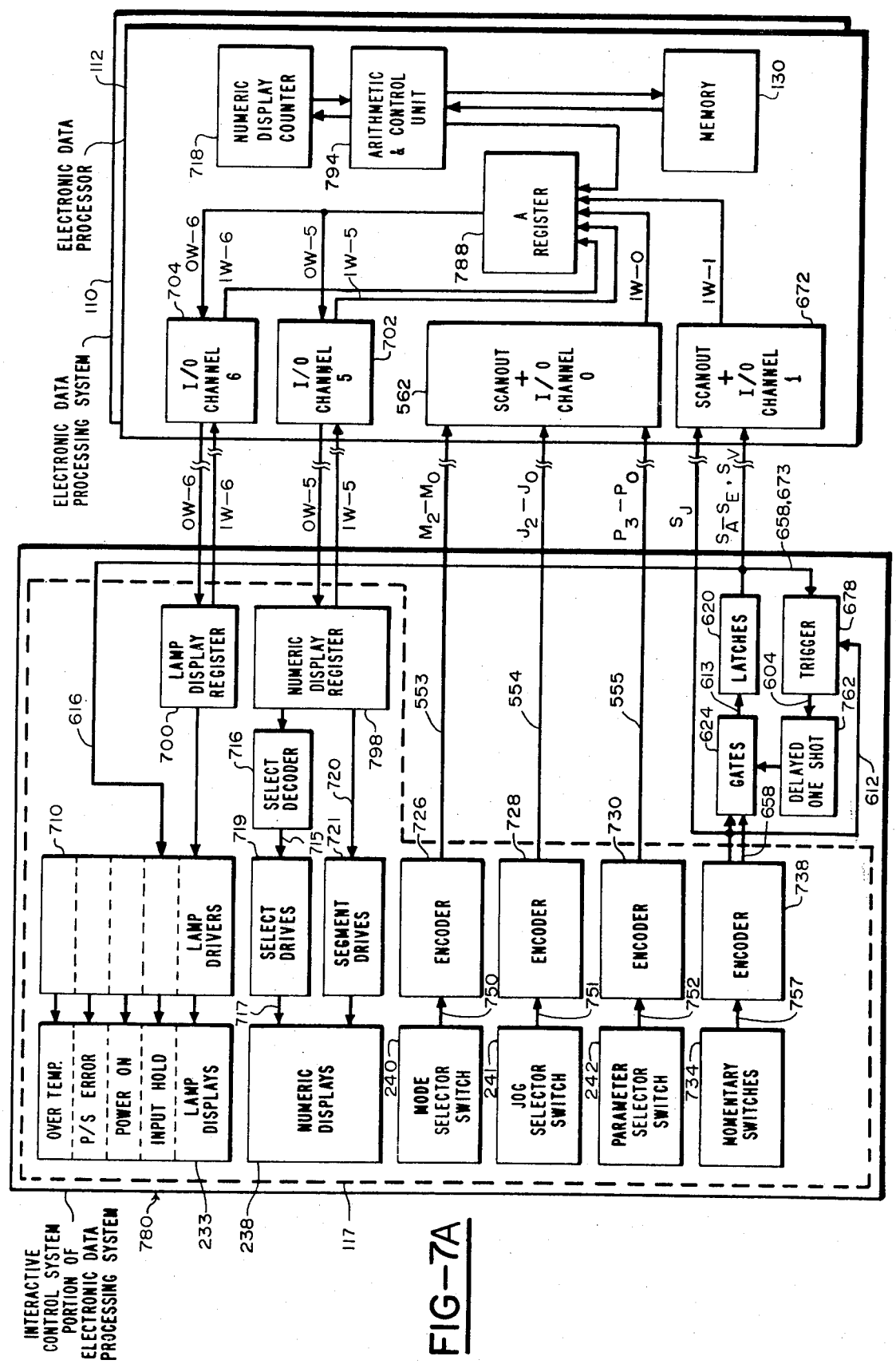
FIG. 7 is a schematic and block diagram representation of the operator panel comprising FIG. 7A showing logic for communication between the data processor and the operator panel and FIG. 7B showing logic for a numeric display.
Figure 7B:
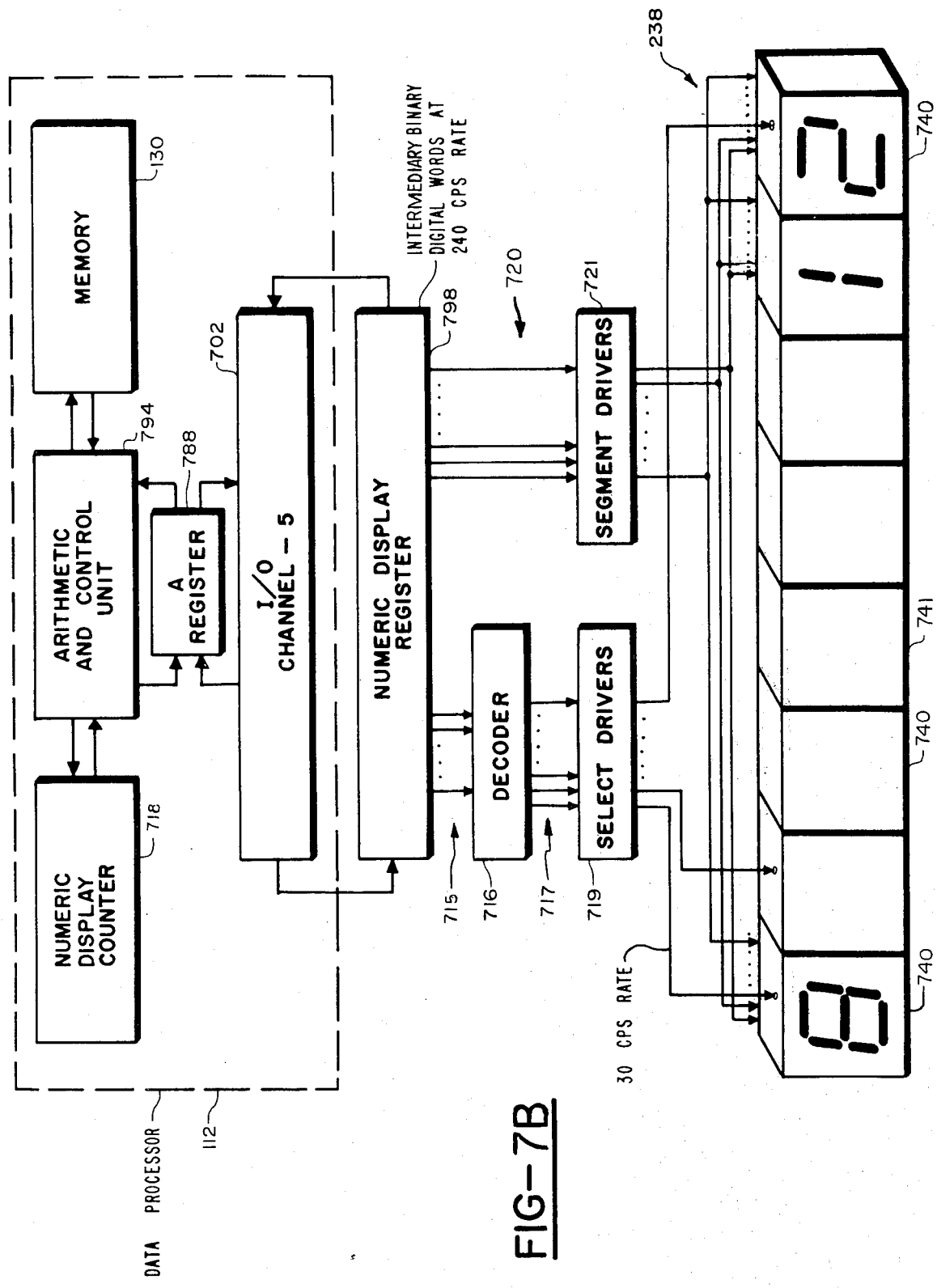
Figure 8C:
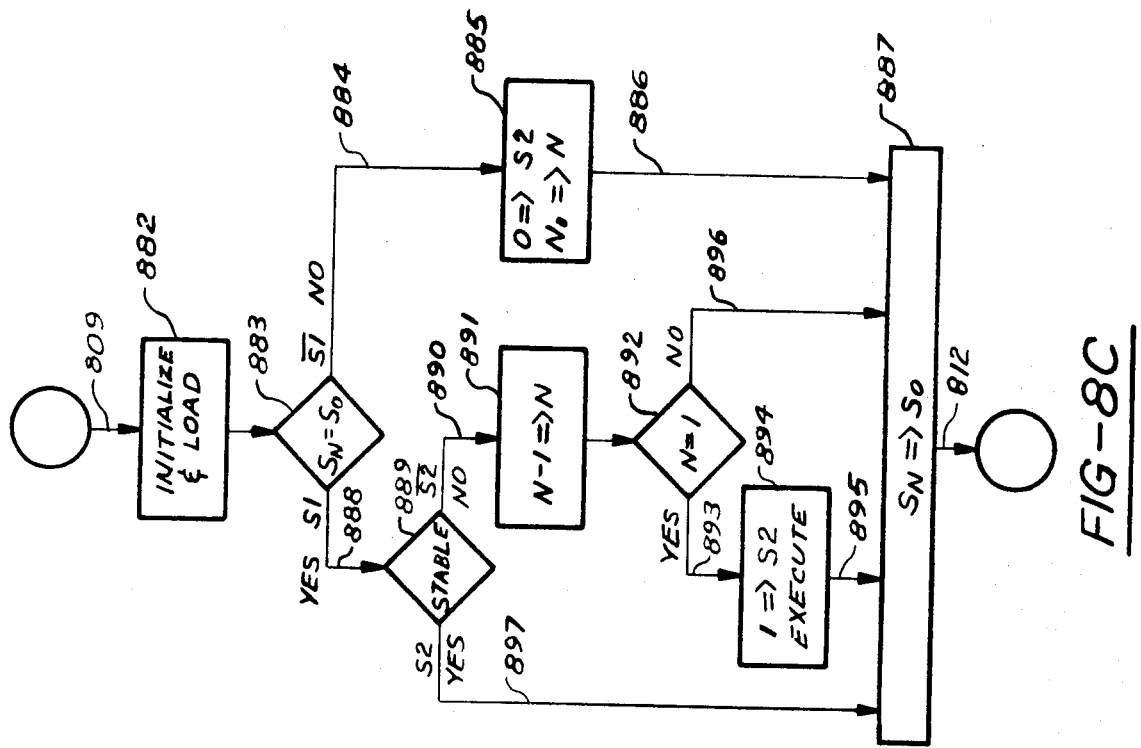
FIG. 8 is a flow diagram representation of further system operations comprising FIGS. 8A-8C showing flow diagrams of various system operations.
Figure 8A:
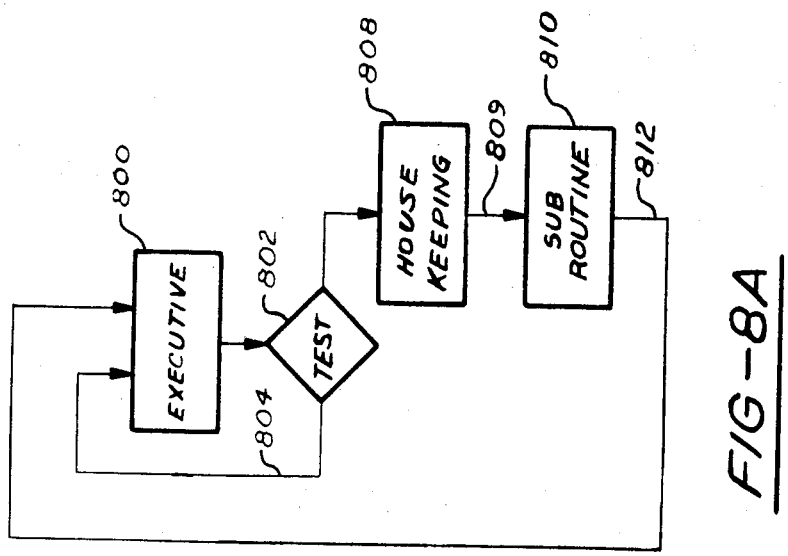
Figure 8B:
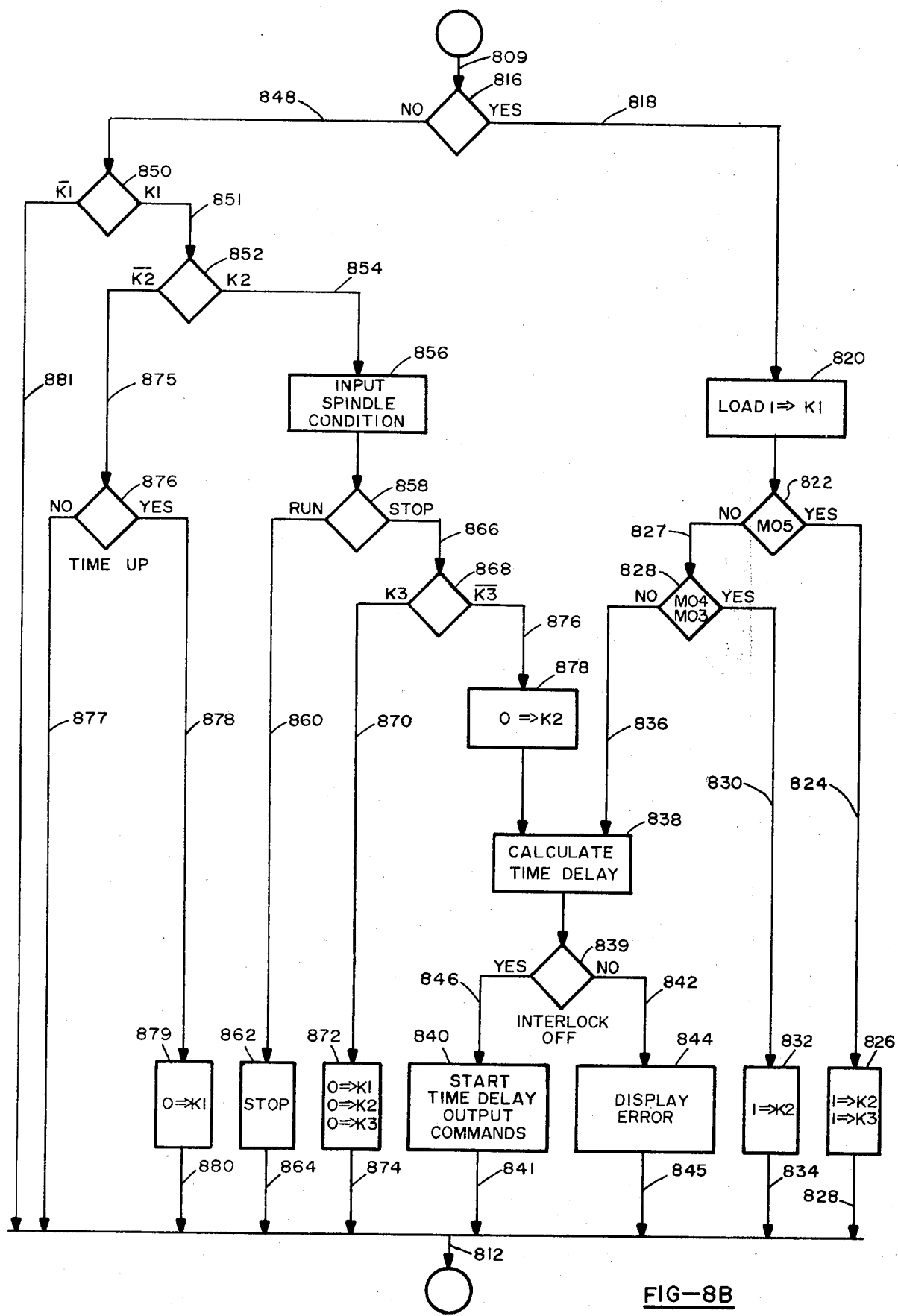

The "data pipe" arrangement will now be discussed. A data pipe concept is illustrated in FIGS. 5A and 6 with the C-Register 585 and C-Register extension 670. The computer A-Register is a 16 bit register; described in the parent applications; yet the interface registers, such as the C-Register that communicate with the A-Register may be of greater length. The combination of the A-Register and the C-Register comprises a data pipe, where the C-Register may be sequentially loaded from the A-Register with parameters output with sequential EX instructions to load these sequential parameters into the interface register and/or to sequentially unload the interface register into the A-Register. The length of the interface register is virtually unlimited, where a sequence of many 16 bit words can be clocked into or clocked out of the interface register. This data pipe concept is further illustrated with the servo registers where the three servos channels, the common board and the A-Register are serially connected as a "data pipe", as illustrated in the parent applications. Data passes from the A-Register and is input to a register of the X axis servo through I/O channel −2. Data then passes from the X axis servo to I/O channel −2 of the Y axis servo. Similarly, data passes out of the Y axis servo into the Z axis servo and out of the Z axis servo to the common board and back to the A-Register. Thus, communication is provided between the data processor, the three servos and the common board.

The interface registers are shown as shift registers, where the output states go through loading transitions as the register is asynchronously preloaded or synchronously shifted such as with the C-Register 560. Typically, the transient nature of these transitions are fast enough so that they will not effect electro-mechanical devices such as relays. If high response equipment senses these register outputs, such as solid state electronic circuits, it may be necessary to eliminate this transient condition. This can be accomplished with logic shown in conjunction with the Z-Register 568, where the bit time signals B0 through B11 gate the clocks to each flip-flop $Z_{11}$ through $Z_o$ so that the flip-flops will be clocked when the corresponding data bit $A_oQ$ is shifted out of the A-Register of the computer 112. Therefore, the Z-Register output lines YL1–YL5, XL1–XL5, and MFE will change only between the last commanded state and the new commanded state without going through transient preload or shift states.

SERVO DESCRIPTION

A description of the interaction of the data processor with a preferred embodiment of the servo arrangement for the system of this invention will now be provided. A detailed description of the servo arrangement is provided in the parent applications, which have been incorporated by reference. In particular, a detailed description of a servo control arrangement in accordance with the system of the present invention is set forth in said parent application Ser. No. 135,040 and a servo command structure in accordance with the present invention is set forth in said parent application Ser. No. 134,958 and Ser. No. 246,867. Said parent application Ser. No. 246,867 is issuing cotemporaneously with the instant application. Said parent application Ser. No. 135,040 was refiled as application Ser. No. 339,817 now U.S. Pat. No. 4,034,276.

An apparatus and method is presented wherein a digital device precisely controls a path of an analog device. By providing integral path defining commands with an independent variable resolution finer than the resolution of the analog device with respect to that variable, the digital device is able to drive the analog device along a smooth but precisely controlled path substantially without discontinuities associated with the digital commands.

In a servo control system in accordance with the invention, a general purpose stored program computer generates integral commands to control a multi-axis servo system. The computer can operate open loop to command the execution of predefined commands as in a numerical control system or can operated closed loop to provode a response to parameters of controlled analog devices. The analog device itself may operate open loop or may have a closed servo loop using analog or time domain feedback signals.

A servo arrangement is discussed in related application Ser. No. 752,751 at page 208 line 24 to page 212 line 11 (now U.S. Pat. No. 4,120,583 at column 104 line 51 to column 106 line 58); which disclosure is herein incorporated by reference.

GENERAL CONSIDERATIONS

From the above description it will be apparent that there is thus provided a device of the character described possessing the particular features of advantage before enumerated as desireable, but which obviously is susceptible to modification in its form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What is claimed is:

1. A high registration photographic exposure system comprising:
   a command device for generating an input command signal;
   an integrated circuit read only memory for storing command information;
   an integrated circuit alterable memory for storing processed information;
   a processor for processing the information stored in said alterable memory in response to the input command signal from said command device under control of the command information stored in said read only memory;
   a control circuit for generating a control signal in response to the processing of information with said processor; and
   a high registration machine for generating a plurality of contact exposures having high registration therebetween in response to the control signal.

2. The system as set forth in claim 1 above, wherein said read only memory is a computer main memory, wherein the stored command information includes a computer program, and wherein said processor is a computer processor.

3. An illumination control system comprising:
a monolithic processor for processing information, said processor including;
(a) an integrated circuit read only memory for storing command information,
(b) an integrated circuit alterable memory for storing processed information, and
(c) integrated circuit processing logic for processing the information stored in said alterable memory under control of the command information stored in said read only memory;
a control circuit for generating a control signal in response to the processing of information with said processing logic; and
a machine for exposing an illumination sensitive medium in response to the control signal.

4. The system as set forth in claim 3 above, wherein said machine is a high registration machine for exposing a high registration photomask medium in response to the control signal.

5. The system as set forth in claim 3 above, wherein said machine is a photographic camera for exposing a photographic film medium in response to the control signal.

6. The system as set forth in claim 3 above, wherein said monolithic processor is a stored program digital computer and wherein the command information stored in said read only memory is a stored program.

7. The system as set forth in claim 3 above, further comprising an operator input device for generating an input signal in response to operator actuation, wherein said processing logic includes operator command logic for processing the information stored in said alterable memory in response to the input signal under control of the command information stored in said read only memory.

8. The system as set forth in claim 3 above, wherein said machine includes a shutter for exposing an illumination sensitive medium in response to the control signal.

9. The system as set forth in claim 3 above, further comprising an operator display for displaying information to an operator in response to a display signal, wherein said monolithic processor includes display logic for generating the display signal in response to the processing of information with said processing logic under control of the command information stored in said read only memory.

10. The system as set forth in claim 3 above, wherein said machine includes means for loading an illumination sensitive medium.

* * * * *